US012790206B2

(12) United States Patent
Solgaard et al.

(10) Patent No.: US 12,790,206 B2
(45) Date of Patent: Nov. 10, 2026

(54) DUAL-LAYER MICRO-RIBBON MEMS LIGHT MODULATOR

(71) Applicant: SILICON LIGHT MACHINES CORPORATION, San Jose, CA (US)

(72) Inventors: Olav Solgaard, Stanford, CA (US); Stephen Hamann, Mountain View, CA (US); Alexander Payne, Ben Lommond, CA (US); Lars Eng, Los Altos, CA (US); James Hunter, Campbell, CA (US); Tianbo Liu, San Jose, CA (US)

(73) Assignee: Silicon Light Machines Corporation, San Jose, CA (US)

( * ) Notice: Subject to any disclaimer, the term of this patent is extended or adjusted under 35 U.S.C. 154(b) by 189 days.

(21) Appl. No.: 18/636,165

(22) Filed: Apr. 15, 2024

(65) Prior Publication Data

US 2025/0026633 A1 Jan. 23, 2025

Related U.S. Application Data

(63) Continuation of application No. 17/872,777, filed on Jul. 25, 2022, now Pat. No. 11,958,738.

(Continued)

(51) Int. Cl.
*B81B 7/02* (2006.01)

(52) U.S. Cl.
CPC .......... *B81B 7/02* (2013.01); *B81B 2201/047* (2013.01); *B81B 2203/0127* (2013.01);

(Continued)

(58) Field of Classification Search
CPC ................ B81B 7/02; B81B 2201/047; B81B 2203/0127; B81B 2203/0163;

(Continued)

(56) References Cited

U.S. PATENT DOCUMENTS

| | | | |
|---|---|---|---|
| 5,459,610 | A | 10/1995 | Bloom et al. |
| 6,384,959 | B1 | 5/2002 | Furlani et al. |

(Continued)

OTHER PUBLICATIONS

International Search Report for (Parent) International Application PCT/US22/38374 Oct. 27, 2022.

(Continued)

*Primary Examiner* — William Choi
(74) *Attorney, Agent, or Firm* — William Nuttle

(57) ABSTRACT

An optical system including a dual-layer microelectromechanical systems (MEMS) device, and methods of fabricating and operating the same are disclosed. Generally, the MEMS device includes a substrate having an upper surface; a top modulating layer including a number of light modulating micro-ribbons, each micro-ribbon supported above and separated from the upper surface of the substrate by spring structures in at least one lower actuating layer; and a mechanism for moving one or more of the micro-ribbons relative to the upper surface and/or each other. The spring structures are operable to enable the light modulating micro-ribbons to move continuously and vertically relative to the upper surface of the substrate while maintaining the micro-ribbons substantially parallel to one another and the upper surface of the substrate. The micro-ribbons can be reflective, transmissive, partially reflective/transmissive, and the device is operable to modulate a phase and/or amplitude of light incident thereon.

21 Claims, 20 Drawing Sheets

Related U.S. Application Data

(60) Provisional application No. 63/225,636, filed on Jul. 26, 2021.

(52) U.S. Cl.
CPC ................. *B81B 2203/0163* (2013.01); *B81B 2203/0353* (2013.01); *B81B 2203/04* (2013.01); *B81B 2203/051* (2013.01); *B81B 2207/05* (2013.01); *B81B 2207/096* (2013.01)

(58) Field of Classification Search
CPC ........ B81B 2203/0353; B81B 2203/04; B81B 2203/051; B81B 2207/05; B81B 2207/096
USPC .......................................................... 359/291
See application file for complete search history.

(56) References Cited

U.S. PATENT DOCUMENTS

| | | | |
|---|---|---|---|
| 6,908,201 B2 | 6/2005 | Gudeman et al. | |
| 6,947,199 B2 | 9/2005 | Roxlo et al. | |
| 6,967,757 B1 * | 11/2005 | Allen | G02B 26/0841 359/224.1 |
| 7,046,420 B1 | 5/2006 | Hunter et al. | |
| 7,064,883 B2 | 6/2006 | Payne et al. | |
| 7,177,081 B2 | 2/2007 | Tomita et al. | |
| 7,202,988 B1 | 4/2007 | Payne et al. | |
| 7,227,687 B1 | 6/2007 | Trisnadi et al. | |
| 7,277,110 B2 | 10/2007 | Zarem et al. | |
| 8,767,170 B2 | 7/2014 | Sano et al. | |
| 11,016,287 B2 | 5/2021 | Payne et al. | |
| 2009/0067034 A1 | 3/2009 | Woo et al. | |
| 2014/0002887 A1 | 1/2014 | Yeung | |
| 2016/0085067 A1 | 3/2016 | Payne et al. | |
| 2018/0095267 A1 | 4/2018 | Payne et al. | |
| 2018/0299664 A1 | 10/2018 | Payne et al. | |
| 2018/0307039 A1 | 10/2018 | Payne et al. | |
| 2020/0026066 A1 | 1/2020 | Ashida | |
| 2021/0072531 A1 | 3/2021 | Ashida et al. | |
| 2021/0072532 A1 | 3/2021 | Payne et al. | |
| 2022/0252862 A1 | 8/2022 | Hamann et al. | |

OTHER PUBLICATIONS

Written Opinion of ISA for (Parent) International Application PCT/US22/38374 Oct. 27, 2022.

* cited by examiner

DUAL-LAYER MICRO-RIBBON MEMS LIGHT MODULATOR

CROSS-REFERENCE TO RELATED APPLICATIONS

This application is a continuation of U.S. patent application Ser. No. 17/872,777, filed Jul. 25, 2022, now U.S. Pat. No. 11,958,738, issued Apr. 16, 2024, which claims the benefit of priority under 35 U.S.C. 119(e) to U.S. Provisional Patent Application Ser. No. 63/225,636, filed Jul. 26, 2021, which is incorporated by reference herein in its entirety.

TECHNICAL FIELD

The present invention relates generally to light modulators, and more particularly to a dual-layer microelectromechanical systems (MEMS) device including an array of micro-ribbons, and methods of fabricating and operating the same.

BACKGROUND

Spatial light modulators are arrays of one or more devices that can control or modulate an incident beam of light in a spatial pattern that corresponds to an electrical input to the devices. The incident light beam, typically generated by a laser, can be modulated in intensity, phase, polarization or direction. Some modulation can be accomplished through the use of Micro-Electromechanical System devices or MEMs that use electrical signals to move micromechanical structures to modulate light incident thereon. Spatial light modulators are increasingly being developed for use in various applications, including display systems, optical information processing and data storage, printing, and maskless lithography.

FIG. 1 shows a linear (1-dimensional) array 100 of a number of ribbon-type spatial light modulators (SLM 102) or diffractors. Generally, each SLM 102 consists of a number of active (movable) ribbons are interlaced or paired with a number of static bias ribbons. By displacing the active ribbons by a quarter wavelength (24) relative to the static ribbons light reflected from the active ribbons interferes with that reflected from the static ribbons, and a square-well diffraction grating is formed along the long axis of the array 100. In the embodiment shown, several ribbon pairs are ganged under action of a single channel driver 104 to form a single MEMS pixel 106. By assembling a large number of MEMS pixels 106 and drivers 104, a continuous, programmable diffraction grating results, such as is particularly useful in printing and lithography applications.

A schematic side view of a deflected active ribbon of the SLM 102 of FIG. 1A is shown in FIG. 1B. Referring to FIG. 1B, one shortcoming of existing ribbon-type SLMs 102 is that when a potential difference is applied between an active ribbon 108 and substrate (not shown) the active ribbon is deflected into a parabolic profile as shown. As a result the square-well diffraction grating is established only in a narrow region near the center-line of the array 100 that is truly displaced by a λ/4. Regions outside this optical "sweet-spot" are neither parallel to the surface of the array 100 nor displaced by λ/4 and therefore cannot provide the desired high contrast and high efficiency modulation. For this reason, illumination onto the standard ribbon-type array 100 must be carefully shaped or focused into a line of illumination 110 using, for example, a Powell Lens. A typical rule of thumb is that the width (W) of the illumination 110 should be no more than about a tenth ($^1/_{10}{}^{th}$) of a length (L) of the ribbon 108.

The need to concentrate the illumination 110 along a narrow line in the middle of the array 100 leads to a number of problems. First, as noted above because of the limited "sweet-spot" of the ribbon-type SLMs sufficient contrast is only achieved when the width of the line illumination 110 is an order of magnitude less than the length of the ribbon 108, and the line illumination is precisely located in the middle of the array 100. If the illumination 110 line-width is too large, or misaligned relative to the array 100, contrast as well as the modulation efficiency will be severely reduced. Thus, the complexity and cost of a SLM using this approach is greatly increased by the need for additional optics, i.e., the Powell Lens, and the need for a mechanism and procedures to precisely align the illumination 110 relative to the array.

A second and more fundamental problem with this approach is that line-illumination concentrates laser power in a thin line having a high power-density, and creating a thermal knife-edge resulting in enormous thermal gradients in the ribbons 108 of the SLM. Moreover, as power density is pushed higher in many applications, in an effort to increase throughput, these thermal gradients continue to increase to the point where the ribbons 108 begin to fail. Typically, the failure mode the ribbons 108 is the "Soret effect" in which atoms of a reflective metal, such as aluminum, covering the ribbons physically migrate 'downhill' along the thermal gradient from a hotter to a cooler region of the ribbon. This migration of metal atoms can reduce the reflection and hence the efficiency of the SLM, and ultimately shortens useful device life.

Accordingly, there is a need for a new light modulator and method of operating the same to provide a larger illumination area, and higher optical power output.

SUMMARY

A dual-layer micro-ribbon microelectromechanical systems (MEMS) device and methods of fabricating and operating an optical system including the same are disclosed. Generally, the MEMS device includes a substrate having an upper surface; a top modulating layer including a number of light modulating micro-ribbons, each micro-ribbon supported above and separated from the upper surface of the substrate by spring structures in at least one lower actuating layer; and a mechanism for moving one or more of the micro-ribbons relative to the upper surface and/or each other. The spring structures are operable to enable the light modulating micro-ribbons to move continuously and vertically relative to the upper surface of the substrate while maintaining the micro-ribbons substantially parallel to one another and the upper surface of the substrate. The micro-ribbons can be reflective, transmissive, partially reflective/transmissive, and the device is operable to modulate a phase and/or amplitude of light incident thereon. The mechanism for moving the number of light modulating micro-ribbons can include electrostatic actuators operable to create an electrostatic force between a substrate electrode in the substrate and actuator electrodes in the spring structures or in the light modulating micro-ribbons.

In some embodiments, the spring structures include a number of hidden-ribbons, each underlying one of the light modulating micro-ribbon and having a long axis parallel with a long axis of the light modulating micro-ribbon and extending under substantially an entire length of the light modulating micro-ribbon. In some versions of this embodiment the spring structures include one or more of spring structures at each end of the light modulating micro-ribbons separated along a long axis of the light modulating micro-ribbon. Optionally, there are a number of openings extending through the substrate to enable light to pass therethrough and impinge on lower surfaces of the light modulating micro-ribbons.

In another embodiment, the lower actuating layer includes an array of two-dimensional (2D) actuators arranged in rows and columns, each 2D actuator including a deformable membrane suspended above the upper surface of the substrate by flexures coupled to a number of first posts at corners of the 2D actuator, and each of the spring structures supporting a light modulating micro-ribbon. In either embodiment the light modulating micro-ribbons can be offset along the long axes thereof so that the one or more of spring structures at each end of each of the light modulating micro-ribbons partially underlies an adjacent light modulating micro-ribbon, and a separation between each adjacent light modulating micro-ribbons is independent of the width of the spring structures.

The MEMS device of the present disclosure is particularly useful in a light detection and ranging (LiDAR) system, and where the MEMS device is operable to modulate phases of at least some of the received light to project light onto a far field scene in two-dimensions, and/or to receive light from the light source reflected from the far field scene, and to de-scan the received light by directing light onto a detector in the LiDAR system while rejecting background light.

The system is also useful in an additive manufacturing system such as a three-dimensional (3D) printing or a Selective laser sintering (SLS), and in a laser marking or surface modification system.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

DETAILED DESCRIPTION

A dual-layer micro-ribbon microelectromechanical systems (MEMS) device or light modulator, and methods of fabricating and operating an optical system including the same are described herein with reference to figures.

In the following description, for purposes of explanation, numerous specific details are set forth in order to provide a thorough understanding of the present invention. It will be evident, however, to one skilled in the art that the present invention can be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein can include both to directly electrically connect two or more components or elements and to indirectly connect through one or more intervening components.

Briefly, the dual-layer micro-ribbon MEMS light modulator generally includes a substrate having an upper surface; a top modulating layer including a number of light modulating micro-ribbons, each micro-ribbon supported above and separated from the upper surface of the substrate by spring structures in at least one lower actuating layer; and a mechanism for moving one or more of the micro-ribbons relative to the upper surface and/or each other.

The mechanism for moving the light modulating micro-ribbons and include electrostatic actuators operable to create an electrostatic force between a substrate electrode in the substrate and actuator electrodes in the spring structures and/or the micro-ribbons.

The spring structures are configured or operable to enable the light modulating micro-ribbons to move continuously and vertically relative to the upper surface of the substrate while maintaining the micro-ribbons substantially parallel to one another and the upper surface of the substrate. The micro-ribbons can be reflective, transmissive, partially reflective/transmissive, and the device is operable to modulate a phase and/or amplitude of light incident thereon.

A method for fabricating a first embodiment of a dual-layer micro-ribbon MEMS light modulator will now be described with reference to FIGS. 2A through 2J, and FIG. 3. FIGS. 2A-2J are sectional views through a substrate illustrating an embodiment of a process or method for fabricating a dual-layer micro-ribbon MEMS light modulator, and FIG. 3 is a flowchart of a method for fabricating the dual-layer micro-ribbon MEMS light modulator according to the method.

Figure 1A:
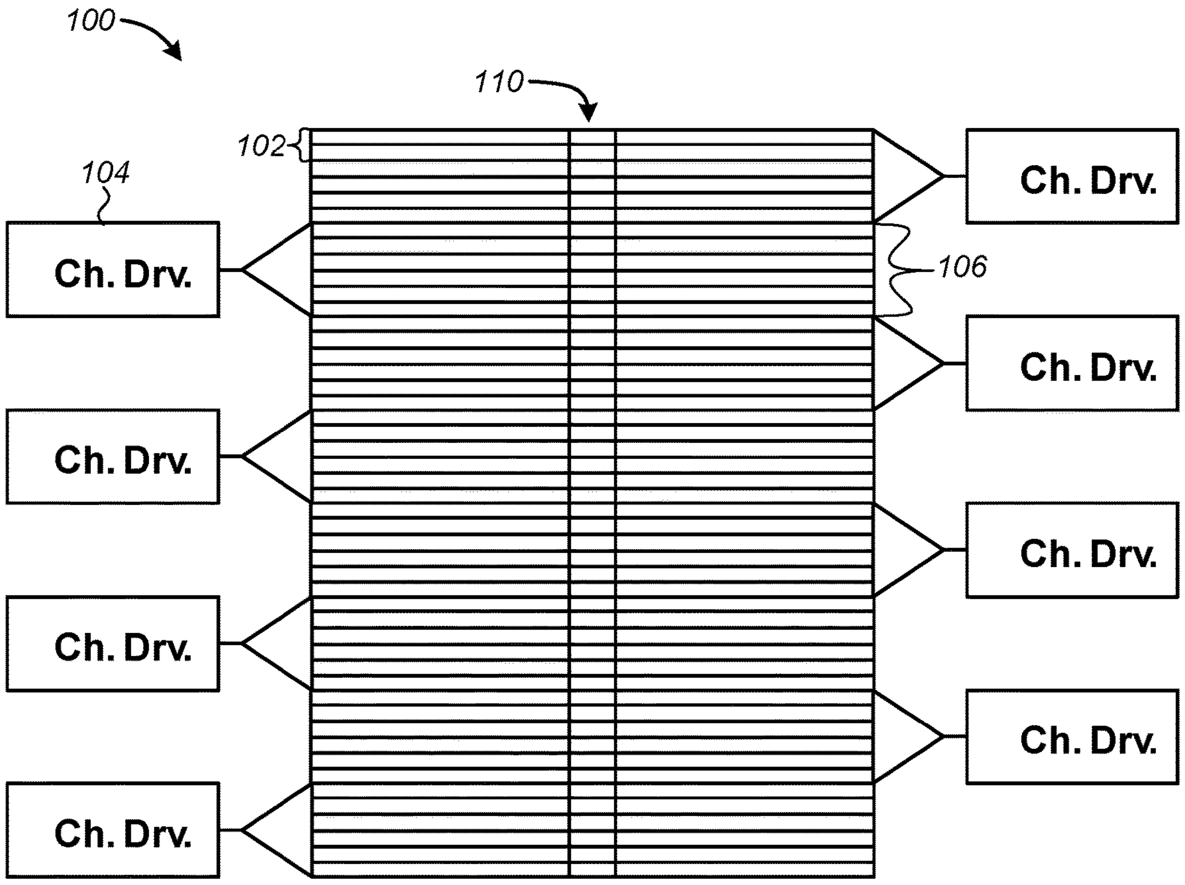
FIG. 1A (Prior Art)
FIG. 1A is a schematic block diagram of a planar top view of a ribbon-type spatial light modulator (SLM)
Figure 1B:
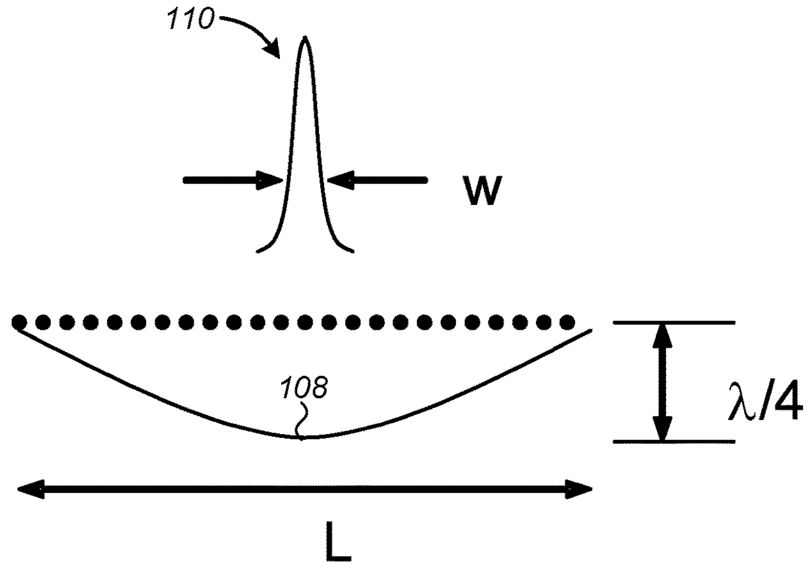
FIG 1B (Prior Art)
FIG. 1B is a schematic side view of a deflected active-ribbon of the SLM of FIG. 1A, illustrating deformation of the light modulating surface.
Figure 2A:
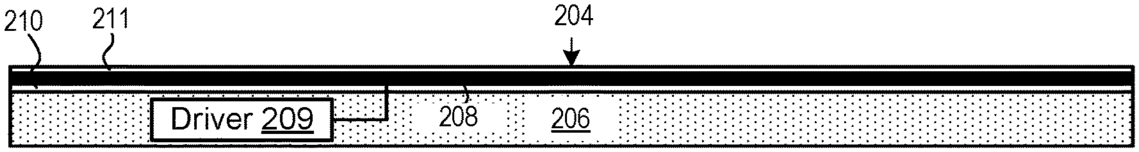
FIGS. 2A-2J are sectional views through a substrate illustrating an embodiment of a process for fabricating a dual-layer micro-ribbon microelectromechanical systems (MEMS) light modulator according to a method of the present disclosure.
Figure 2B:
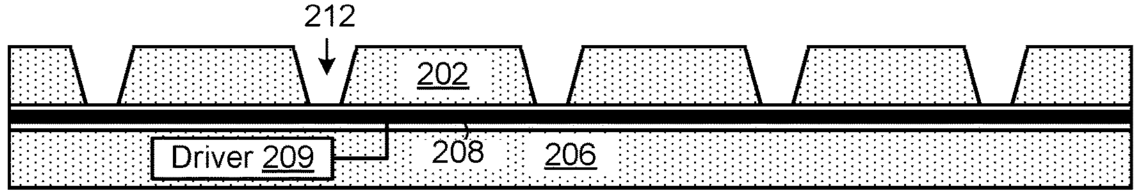
Figure 3:
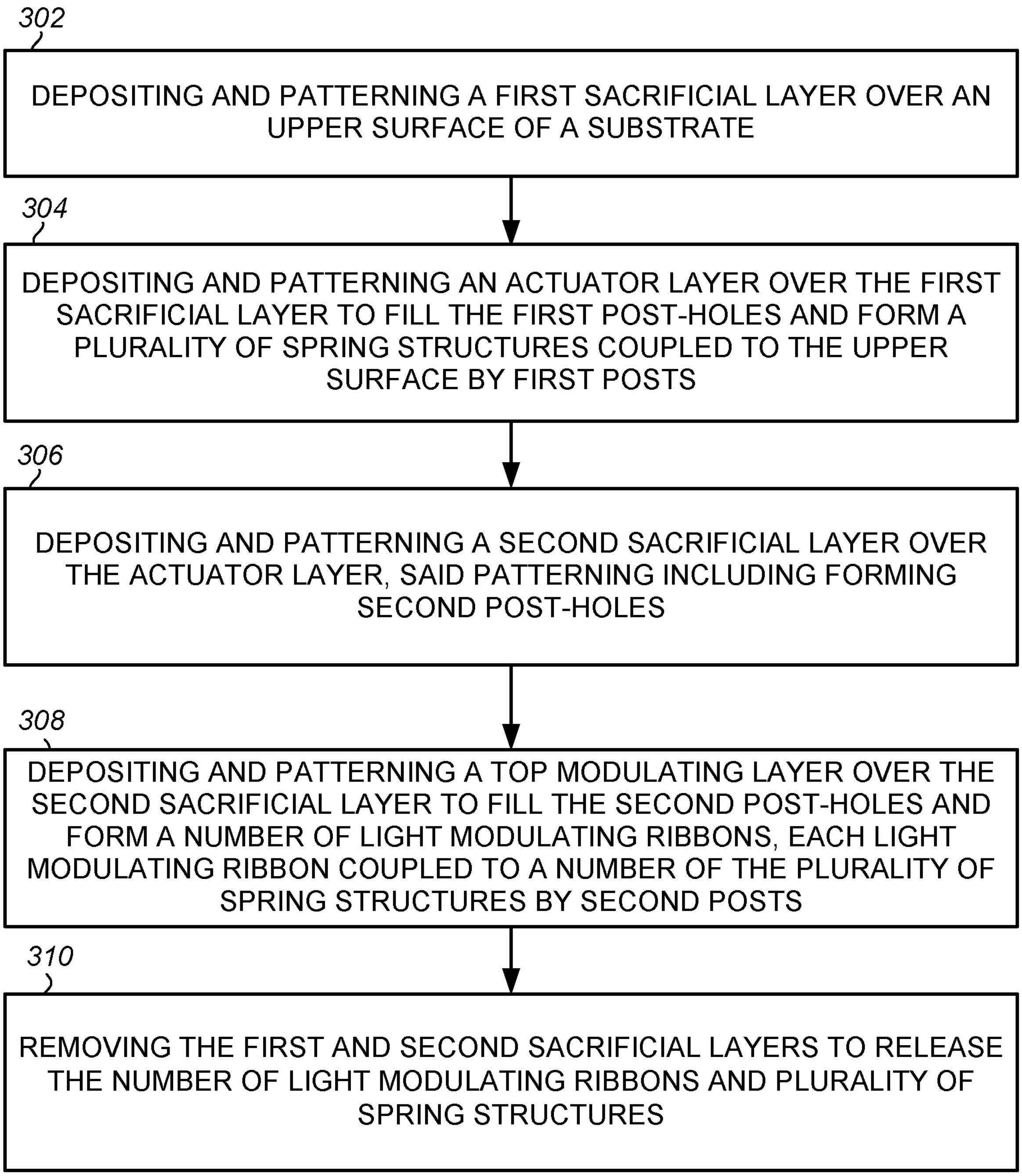
FIG. 3 is a flowchart of a method for fabricating a dual-layer micro-ribbon MEMS light modulator of FIGS. 2A-21 according to a method of the present disclosure.

Referring to FIGS. 2A and 2B, and FIG. 3, the method begins with depositing and patterning a first sacrificial layer 202 over an upper surface 204 of an electrically active substrate 206 (step 302). By electrically active it is meant a substrate 206 in or on which a lower or substrate electrode 208 has been formed, and, typically, one in which a drive circuit or driver 209 has been previously fabricated using standard integrated circuit (IC) technologies either below or adjacent to regions in which micro-ribbons are to be formed. Generally, the substrate 206 can include any suitable semiconductor or dielectric material such as silicon, and the substrate electrode 208 can include one or more layers of any suitable electrically conductive metal or material, such as aluminum, copper, tungsten, titanium, or an alloy such as silicon germanium deposited using any suitable chemical vapor deposition (CVD) or physical vapor deposition (PVD) technique and patterned using standard photolithographic techniques and etches. In some embodiments, such as that shown, the method and structure can further include depositing a thin intermediate dielectric layer 210, such as a silicon oxide over the substrate 206 prior to forming the substrate electrode 208. In some embodiments, such as that shown, the method and structure can further include depositing a second thin dielectric layer 211, such as a silicon oxide, over the substrate electrode 208 prior to depositing the first sacrificial layer 202.

The first sacrificial layer 202 can include either polycrystalline silicon or germanium, and is generally deposited to a thickness of about 5/4 a target wavelength in air of a light to be modulated by the a dual-layer micro-ribbon MEMS light modulator to avoid a potentially destructive phenomenon commonly referred to as "snap-down" or "pull-in," in which a spring structure or micro-ribbon (not shown in FIG. 2A or 2B) including an actuator electrode snaps into contact with the substrate electrode 208 and sticks there even when an electrostatic force is removed. Patterning of the first sacrificial layer 202 includes forming first post holes 212 for posts to support an actuator layer 214 of the dual-layer micro-ribbon MEMS light modulator. Deposition of the first sacrificial layer 202 can be accomplished using CVD, and the patterning can be accomplished using standard photolithographic techniques and etches.

Figure 2C:
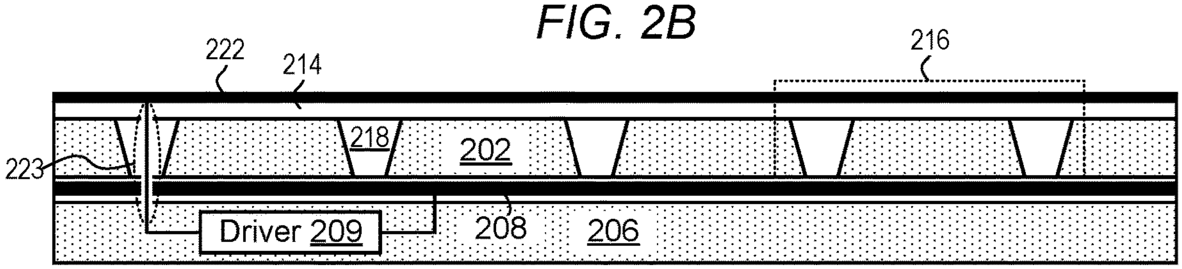
Figure 2D:
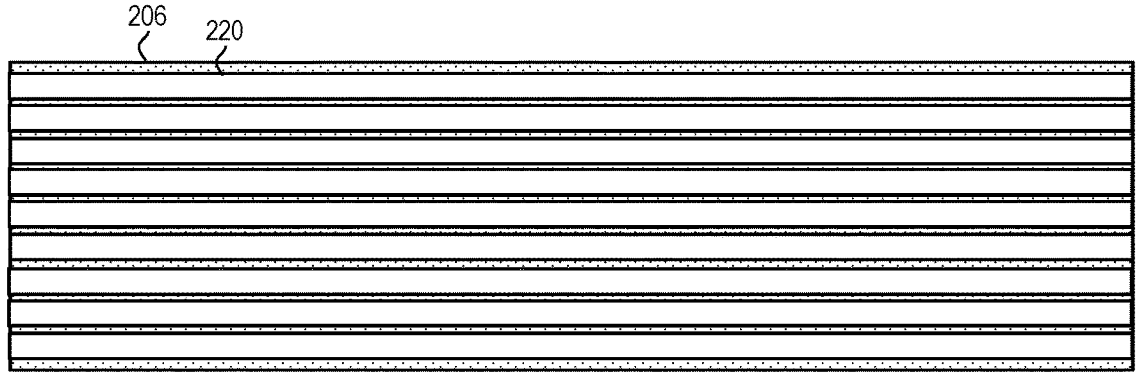

Next, referring to FIGS. 2C and 2D, and FIG. 3, a layer of a tensile material is deposited over the first sacrificial layer 202 and patterned to fill the first post holes 212 and form the actuator layer 214 including a plurality of spring structures 216 coupled to the upper surface 204 by first posts 218 (step 304). The tensile material can include silicon-nitride (SiN) or silicon-germanium (SiGe), and can be deposited using CVD, and patterned using standard photolithographic techniques and etches. By spring structures 216 it is meant a thin, flexible-ribbon or membrane supported above and separated from the upper surface 204 of the substrate 206 by a number of the by first posts 218, and to which the micro-ribbons can be subsequently anchored. Referring to FIG. 2D, in the embodiment shown patterning the tensile material to form the actuator layer 214 includes patterning the tensile material to form a number of hidden-ribbons 220, each including a number of spring structures 216 formed by two adjacent first posts 218 and a portion of the hidden-ribbon coupled to or supported by the two adjacent first posts.

In some embodiments, such as that shown, depositing and patterning the tensile material to form actuator layer 214, step 304, can further include forming an actuator electrode 222 over the tensile material prior to patterning to form the actuator layer. An electrostatic force between a substrate electrode 208 and actuator electrodes 222 provides a mechanism for moving the light modulating micro-ribbons of the completed dual-layer micro-ribbon MEMS light modulator.

As with the substrate electrode 208, actuator electrode 222 can include one or more layers of metal, such as aluminum, copper, tungsten, titanium, or an alloy such as SiGe deposited using CVD or PVD. One or more of the first posts 218 can include an electrically conductive via 223 or a conducting layer on an outer surface of the post (not shown), through which the actuator electrode 222 is coupled to the driver 209. Alternatively, where the actuator layer 214 and the first posts 218 are formed of an electrically conductive material, such as SiGe, One or more of the first posts 218 can serve as the electrical interconnect between the actuator electrode 222 and the driver 209.

For the dual-layer micro-ribbon MEMS light modulator formed by the present method each hidden-ribbon 220 will underlie one of a number of subsequently formed light modulating micro-ribbons, and have a long axis parallel with a long axis of the light modulating micro-ribbon, and extending under substantially an entire length of the light modulating micro-ribbon. In other embodiments, such as that shown and described below with reference to FIGS. 4A and 4B, the hidden-ribbons 220 can have a length substantially shorter than that of an overlying light modulating micro-ribbon and located at distal ends of the micro-ribbons, and with fewer spring structures 216.

Figure 2E:
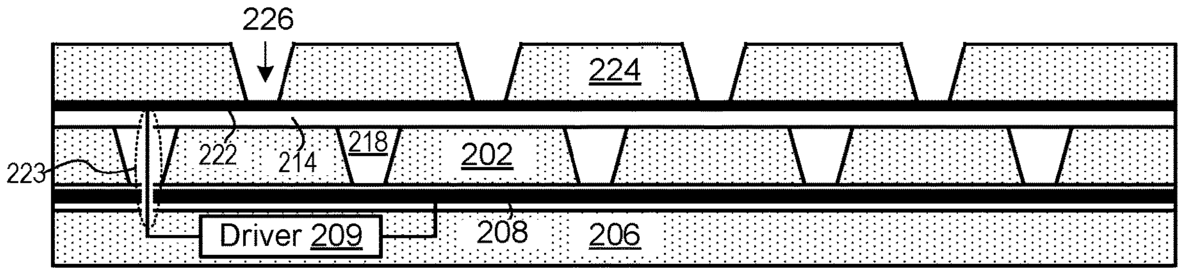

Referring to FIGS. 2E and 3, a second sacrificial layer 224 is deposited and patterned over the actuator layer 214 (step 306). As with the first sacrificial layer 202 can include either poly-crystalline silicon or germanium deposited by CVD, and is patterned using standard photolithographic techniques and etches to include second post holes 226 for posts to support a top modulating layer 228 of the dual-layer micro-ribbon MEMS light modulator.

Figure 2F:
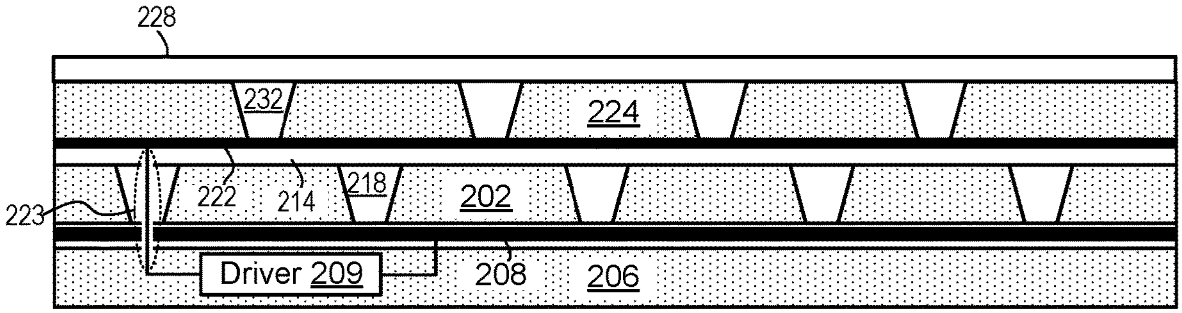
Figure 2G:
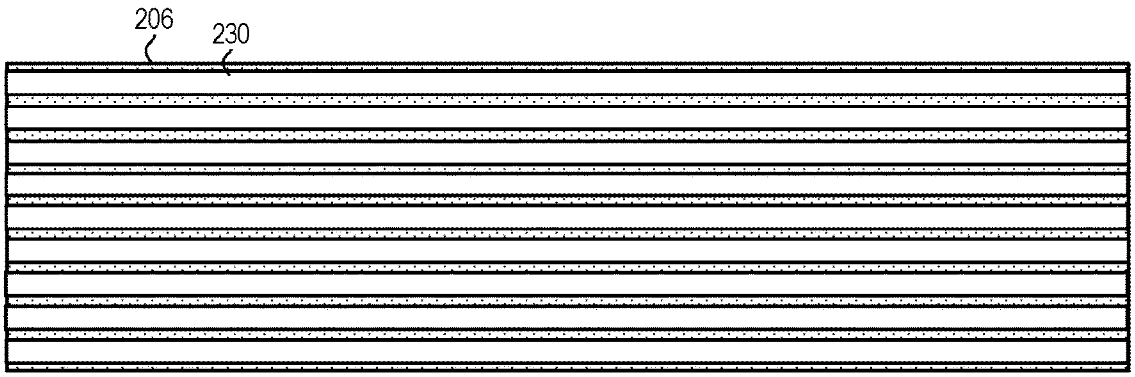

Next, referring to FIGS. 2F and 2G, and FIG. 3, another layer of a tensile material is deposited over the second sacrificial layer 224 and patterned to fill the second post holes 226 and form the top modulating layer 228 including a number of light modulating micro-ribbons 230 coupled to the spring structures 216 by second posts 232 (step 308). The tensile material can include SiN or SiGe, and can be deposited using CVD, and patterned using standard photolithographic techniques and etches. Referring to FIG. 2G, in the embodiment shown patterning the tensile material to form the top modulating layer 228 includes patterning the tensile material to form the number of light modulating micro-ribbons 230.

Figure 2H:
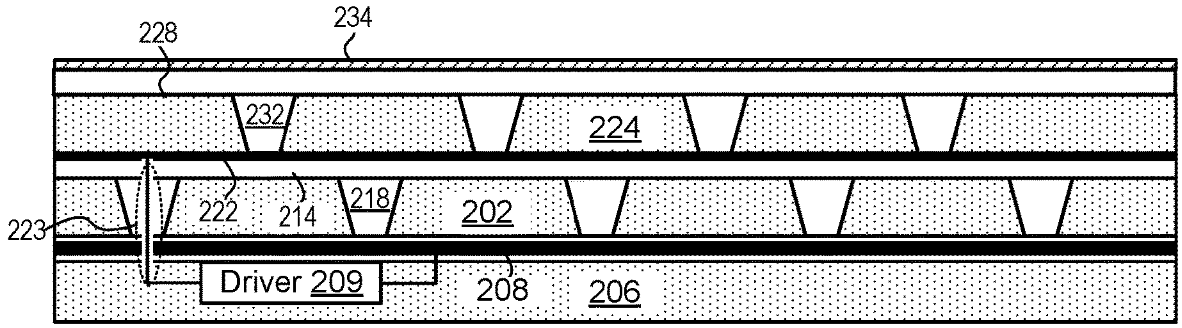
Figure 2I:
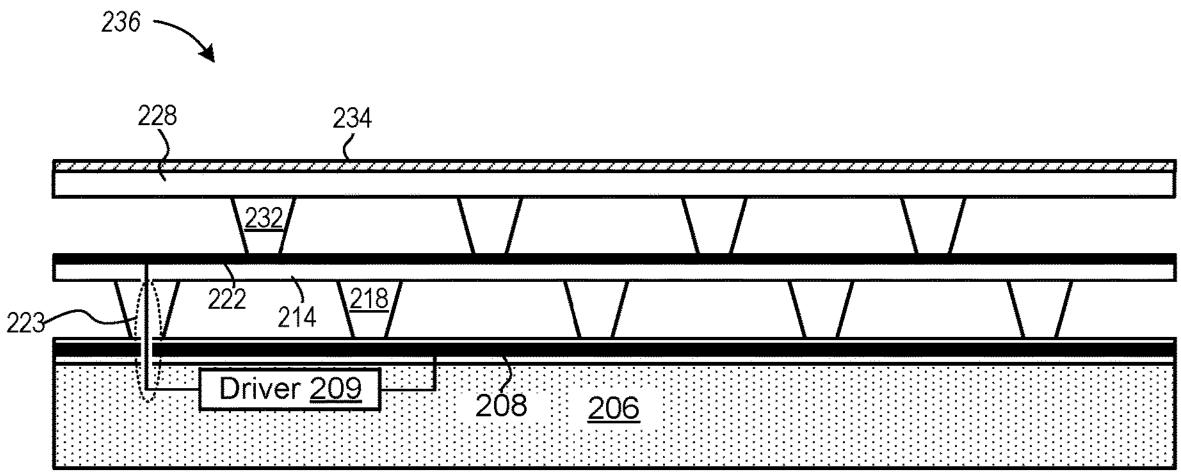

Optionally, as in the embodiment shown in FIG. 2H, depositing and patterning the tensile material to form the top modulating layer 228, step 308, can further include forming a reflective layer 234 over the tensile material prior to patterning to a reflective the dual-layer micro-ribbon MEMS light modulator. The reflective layer 234 can be deposited using CVD or PVD, and can include a layer of metal, such as aluminum (Al), or a dielectric or Bragg mirror including alternating layers of transmissive dielectric material reflective to at least some wavelengths of light to be modulated the dual-layer micro-ribbon MEMS light modulator. In one embodiment, the reflective layer 234 includes a metal; the reflective layer can also serve as an actuator electrode for the dual-layer micro-ribbon MEMS light modulator coupled to the driver 209 through electrically conductive via 223 in the first posts 218 and a second via in one or more of the second posts 232.

Figure 2J:
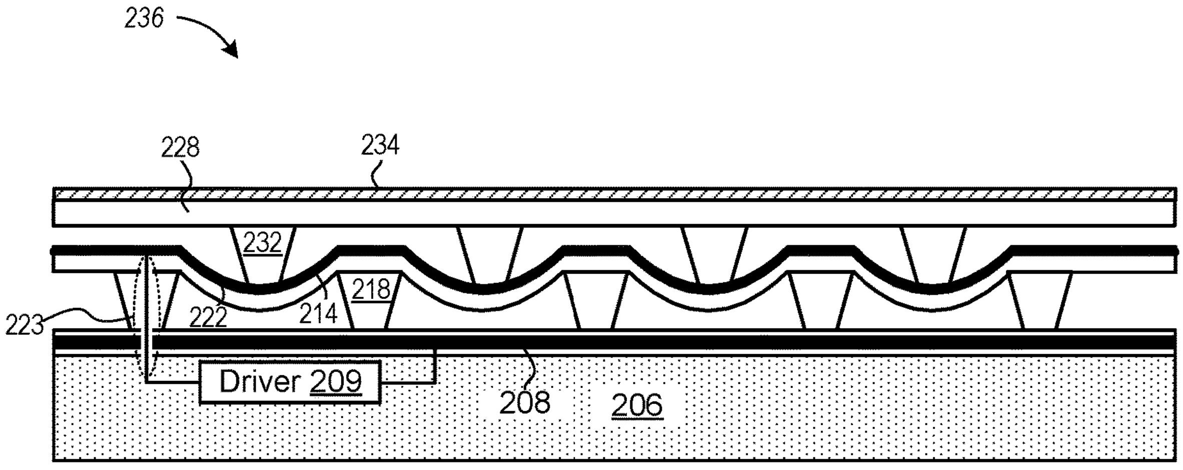

Finally, referring to FIGS. 21 and 3, the first and second sacrificial layers 202, 224 are etched or removed to simultaneously release both the light modulating micro-ribbons 230 and the number of spring structures 216 (step 310). The first and second sacrificial layers 202, 224 can be removed using a noble gas fluoride, such Xenon difluoride ($XeF_2$), in a dry etch process selective to the material of the sacrificial layers to yield the dual-layer micro-ribbon MEMS light modulator 236 shown in FIG. 2I in a quiescent or undeflected state. FIG. 2J illustrates the dual-layer micro-ribbon MEMS light modulator 236 in an active or deflected state.

Figure 4A:
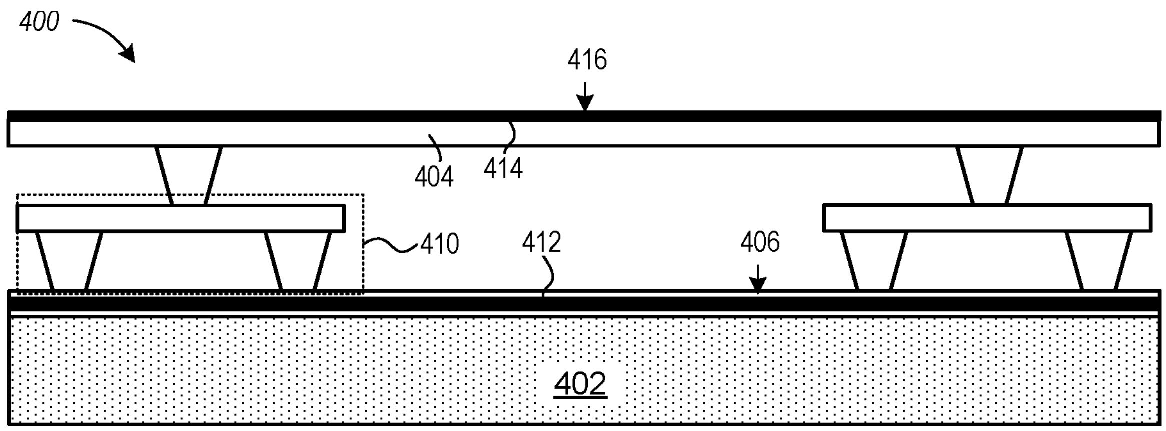
FIGS. 4A-4C are sectional views through a substrate illustrating another embodiment a dual-layer micro-ribbon MEMS light modulator in an undeflected and deflected state, respectively.
Figure 4B:
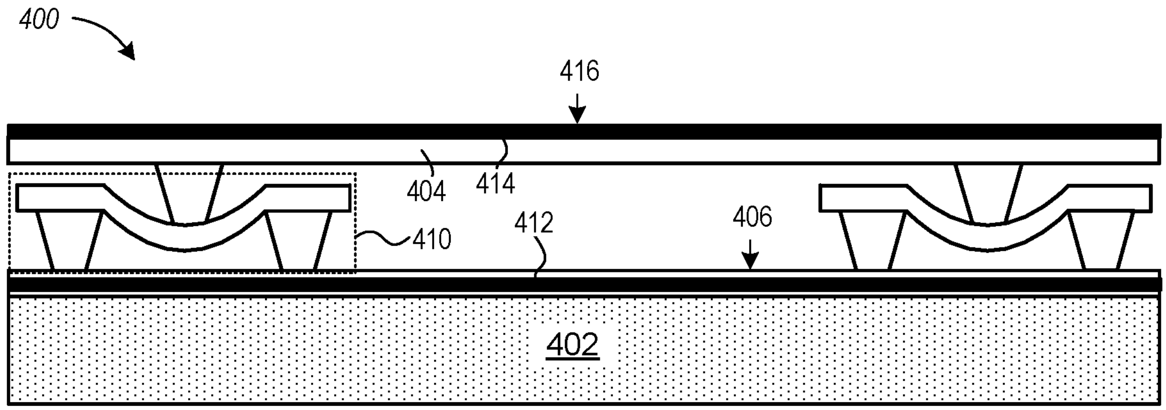

FIGS. 4A and 4B are sectional views through a substrate 402 illustrating another embodiment a dual-layer micro-ribbon MEMS light modulator 400 in which a number of light modulating micro-ribbons 404 are supported above an upper surface 406 of the substrate 402 by a number of spring structures 410 at ends of the micro-ribbons. FIG. 4A illustrates the dual-layer micro-ribbon MEMS light modulator 400 in quiescent or undeflected state, and FIG. 4B illustrates the dual-layer micro-ribbon MEMS light modulator in an active or deflected state. As in embodiments of the dual-layer micro-ribbon MEMS light modulator shown and described above with respect to FIGS. 2A to 2J, the dual-layer micro-ribbon MEMS light modulator 400 includes a substrate electrode 412 in the substrate 402, and an actuator electrode 414, shown here as being formed in or on the light modulating micro-ribbons 404. Generally, the dual-layer micro-ribbon MEMS light modulator 400 further includes a driver circuit or driver (not shown in these figures) integrally formed in or on the substrate 402 adjacent to or underlying the light modulating micro-ribbons 404. The actuator electrode 414 can be coupled to a driver through vias extending through the posts coupling the light modulating micro-ribbons 404 to the spring structures 410 and posts in of the spring structures.

In some embodiments, such as that shown, the actuator electrode 414 includes a metal layer on each of the light modulating micro-ribbons 404, and the metal layer is also operable to form a light reflective surface 416 to reflect light incident thereon. Alternatively, in an embodiment not shown in these figures, the dual-layer micro-ribbon MEMS light modulator 400 can further include a dielectric or Bragg mirror deposited on or over the actuator electrode 414.

Figure 4C:
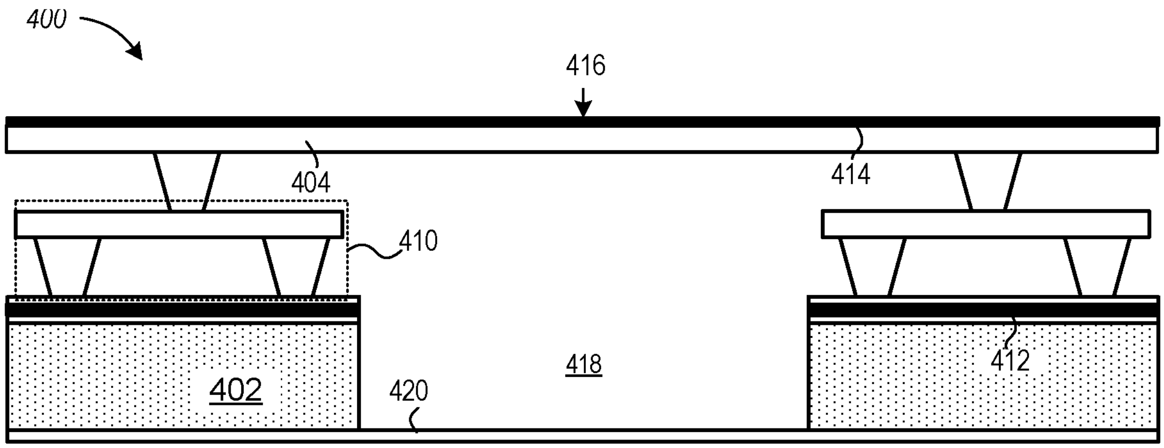

In yet another embodiment, shown in FIG. 4C, the dual-layer micro-ribbon MEMS light modulator 400 includes a number of windows or openings 418 extending through the substrate 402, which are operable or configure and positioned to enable light to pass therethrough and impinge on lower surfaces of the light modulating micro-ribbons 404 facing the upper surface 406 of the substrate. The openings 418 can be etched through the substrate 402 using a deep reactive-ion etching (DRIE), a potassium hydroxide (KOH) etch, or other suitable wet or dry etch. In this embodiment, the light modulating micro-ribbons 404 can be reflective, transmissive, partially reflective or partially transmissive, and to modulate a phase and/or amplitude of light incident thereon. Optionally, as in the embodiment shown, the dual-layer micro-ribbon MEMS light modulator 400 can further include a transparent layer 420, such glass or a silicon nitride (SiN) layer, covering the openings 418.

Figure 5A:
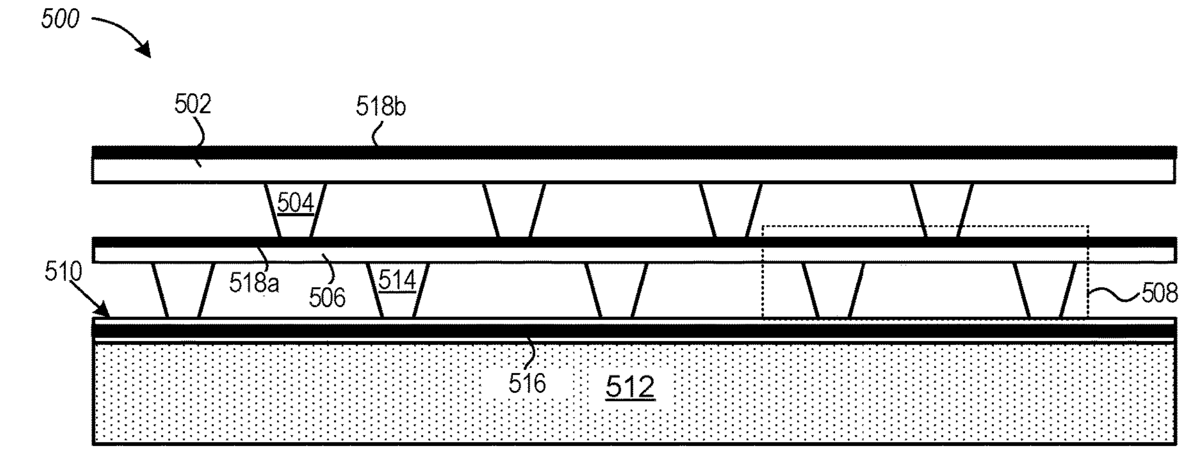
FIGS. 5A-5C are sectional views through a substrate illustrating other embodiments a dual-layer micro-ribbon MEMS light modulator having other actuator electrode configurations.
Figure 5B:
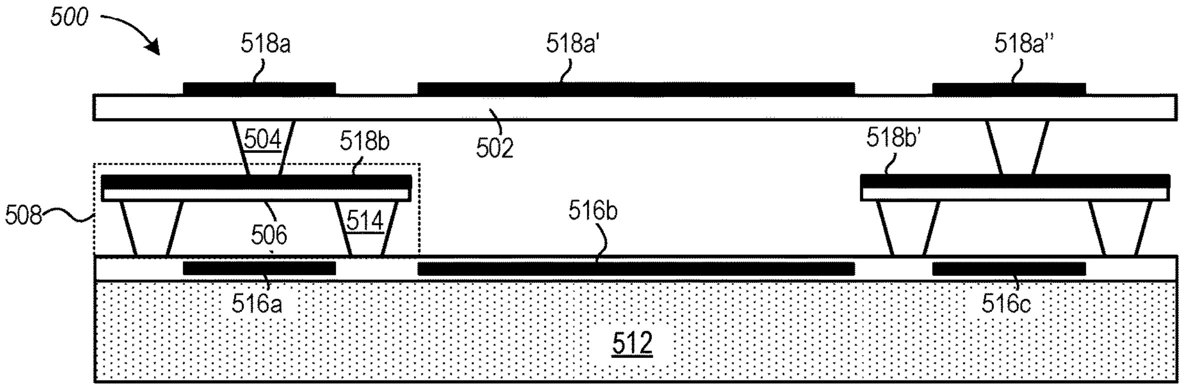
Figure 5C:
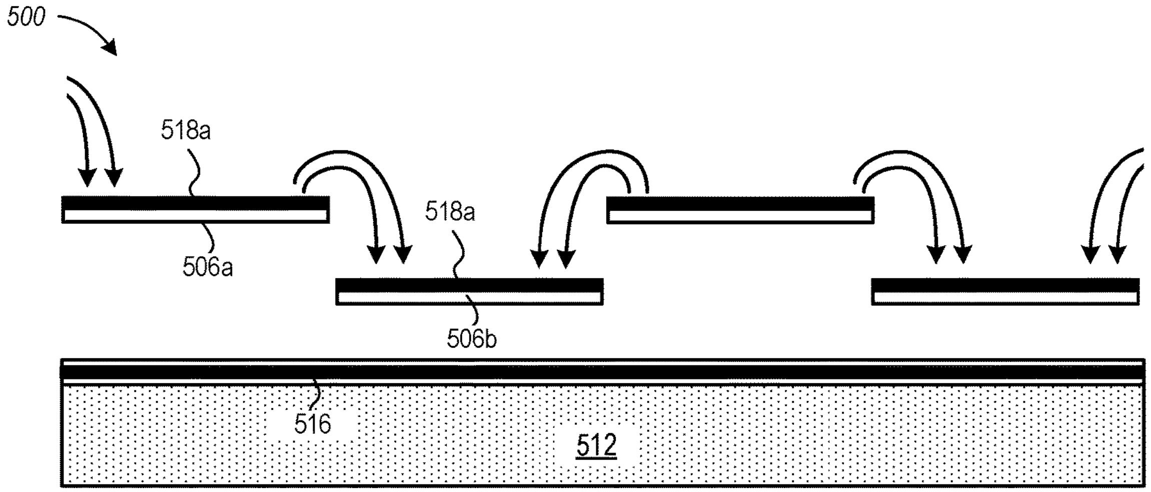

FIGS. 5A-5C are sectional views through a substrate illustrating other embodiments a dual-layer micro-ribbon MEMS light modulator 500, having other actuator electrode and substrate electrode configurations.

Referring to FIG. 5A in a first embodiment the dual-layer micro-ribbon MEMS light modulator 500 includes a number of light modulating micro-ribbons 502, each supported on second posts 504 by a hidden-ribbon 506 including a number of spring structures 508 above an upper surface 510 of a substrate 512. Each of the spring structures 508 are formed by two adjacent first posts 514 and a portion of the hidden-ribbon 506 coupled to or supported by two adjacent first posts. The dual-layer micro-ribbon MEMS light modulator 500 further includes a substrate electrode 516 electrically coupled to a driver (not shown), and differs from that shown and described above with reference to FIGS. 2A-2J in that includes in multiple actuator electrodes 518*a*, 518*b*, one in or on each of the hidden-ribbon 506, and one in or on each of the light modulating micro-ribbons 502 provide better pull-in characteristics. In particular, applying an electrostatic force between the actuator electrode 518*a* in one of the hidden-ribbons 506 and the substrate electrode 516 enables an overlying light modulating micro-ribbon 502 to be pulled down without applying an electrostatic force between the substrate electrode and the actuator electrode 518*b* in the overlying light modulating micro-ribbon 502. Applying an electrostatic force between the substrate electrode 516 and both the actuator electrode 518*a* in the hidden-ribbon 506 and the actuator electrode 518*b* in the overlying light modulating micro-ribbon 502 enables each of the overlying light modulating micro-ribbons to be moved more quickly, deflected further or with greater control of individual micro-ribbons. It is noted that the voltage applied to each of the actuator electrodes 518*a*, 518*b*, need not be equal in magnitude or polarity. For example, applying an electrostatic force between the substrate electrode 516 and the actuator electrode 518*b* in the overlying light modulating micro-ribbon 502 only enables the hidden-ribbon 506 to function as a damping structure to reduce the potential for snap-down.

Referring to FIG. 5B in another embodiment the dual-layer micro-ribbon MEMS light modulator 500 includes spring structures 508 support at ends of each light modulating micro-ribbons 502, multiple individually addressable substrate electrodes 516*a*, 516*b*, 516*c*, multiple individually addressable actuator electrode 518*a*, 518*a'*, in the hidden-ribbon 506, and multiple individually addressable actuator electrode 518*b*, 518*b'*, 518*b"* in the light modulating micro-ribbons 502. This embodiment enables greater control of operation of each of the individual light modulating micro-ribbons 502. It is noted that the voltage applied to each of the substrate and actuator electrodes need not be equal in magnitude or polarity.

FIG. 5C is a cross-sectional view of the dual-layer micro-ribbon MEMS light modulator 500 shown in FIGS. 5A and 5B perpendicular to long axes of the hidden-ribbons 506, and the light modulating micro-ribbons (not shown in this figure) illustrating how individually addressable actuator electrodes 518*a* on adjacent hidden-ribbons can be actuated by comb-drives to lift one or more of the hidden-ribbons. It is noted that although the light modulating micro-ribbons 502 are not shown in this figure, they are supported above the hidden-ribbons 506 by second posts 504 as shown and described above.

Referring to FIG. 5C, if the upper hidden-ribbons 506*a* are fixed or held stationary, then fringing fields (shown by arrows) between actuator electrodes 518*b* will lift the lower hidden-ribbons 506*b*. If the lower hidden-ribbons 506*b* are fixed, then the fringing fields will pull the upper hidden-ribbons 506*a* down. If neither hidden-ribbons are fixed, then both will move relative to one another. This lifting comes in addition to the pull down that caused by an electrostatic force generated between the actuator electrodes 518*a* and substrate electrode(s) 516.

Figure 6:
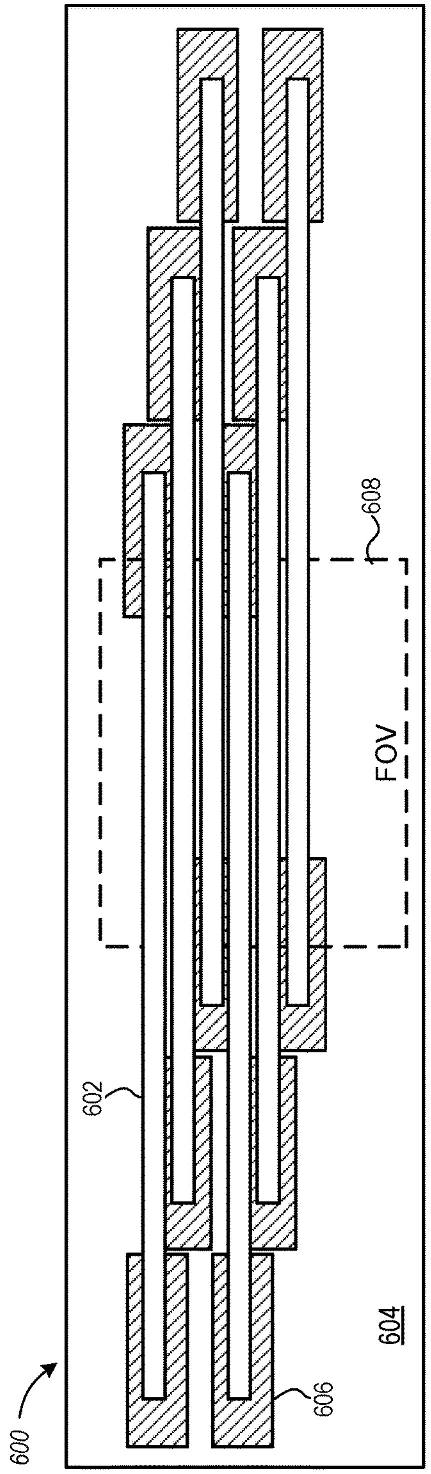
FIG. 6 is a schematic block diagram of a planar top view of an embodiment a dual-layer micro-ribbon MEMS light modulator having longitudinally offset or staggered micro-ribbons.

FIG. 6 is a schematic block diagram of a planar top view of an embodiment a dual-layer micro-ribbon MEMS light modulator 600 having longitudinally offset or staggered light modulating micro-ribbons 602. Referring to FIG. 6C the light modulating micro-ribbons 602 are supported above an upper surface of a substrate 604 by a number of spring structures 606 at each end thereof. Offsetting the light modulating micro-ribbons 602 enables the spring structures at each end of each of the number of light modulating micro-ribbons to partially underlie an adjacent light modulating micro-ribbon, so that a separation or pitch between each of the adjacent light modulating micro-ribbons is independent of the greater width of the number of spring structures 606. It is noted that the spring structures 606 have a width greater than that of the micro-ribbons 602 yields improved actuation and stability by providing a larger actuator electrode (not shown) on each of the spring structures. It is further noted that only a center section of the staggered light modulating micro-ribbons 602 would be illuminated in a field of view (FOV 608).

Figure 7:
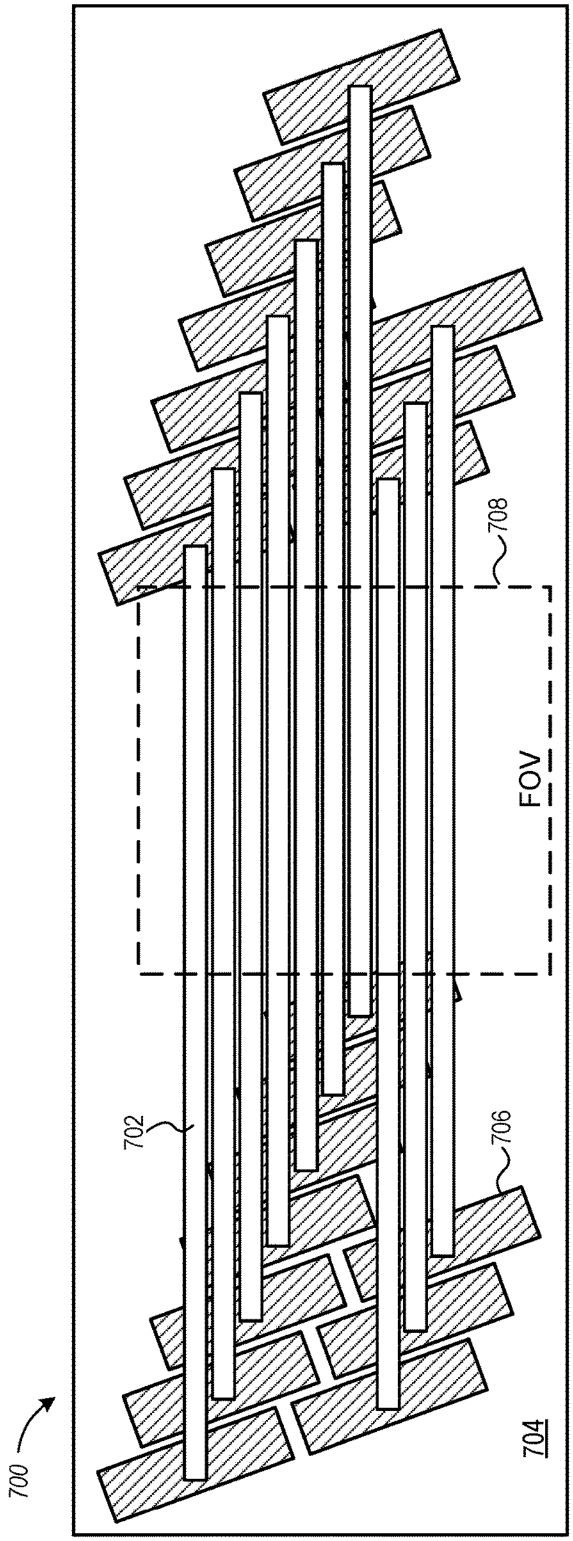
FIG. 7 is a schematic block diagram of a planar top view of another embodiment a dual-layer micro-ribbon MEMS light modulator having longitudinally offset or staggered micro-ribbons.

FIG. 7 is a schematic block diagram of a planar top view of another embodiment a dual-layer micro-ribbon MEMS light modulator 700 having longitudinally offset or staggered micro-ribbons 702 supported above an upper surface of a substrate 704 by a number of spring structures 706 at each end thereof. This embodiment enables wider spring structures 706, and a field of view (FOV 708).

Figure 8:
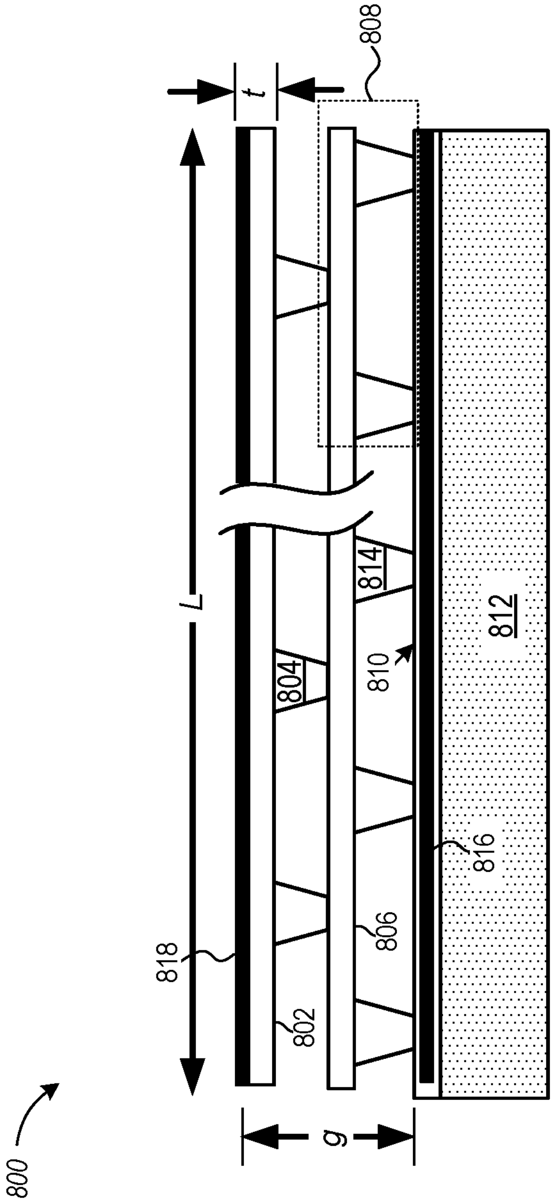
FIG. 8 is a sectional view through a substrate illustrating a portion of a micro-ribbon in a dual-layer micro-ribbon MEMS light modulator including hidden-ribbon with a number of spring structures underlying a micro-ribbon.

Stress on the hidden-ribbon will now be described with reference to a model of a dual-layer micro-ribbon MEMS light modulator shown in FIG. 8. FIG. 8 is a sectional view through a substrate illustrating a portion of a micro-ribbon in a dual-layer micro-ribbon MEMS light modulator 800 and includes a number of light modulating micro-ribbons 802, each supported on second posts 804 by a hidden-ribbon 806 including a number of spring structures 808 above an upper surface 810 of a substrate 812. Each of the spring structures 808 is formed by two adjacent first posts 814 and a portion of the hidden-ribbon 806 coupled to or supported by two adjacent first posts. The dual-layer micro-ribbon MEMS light modulator 800 further includes a substrate electrode 816 electrically coupled to a driver (not shown), and an actuator electrode 818 formed in or on the light modulating micro-ribbons 802. Referring to FIG. 8, the light modulating micro-ribbons 802 and the hidden-ribbons 806 can have a length (L) between 50 to 100 micrometers (μm), a-ribbon thickness of 100 to 300 nanometers (nm), and the actuator electrode 818 is separated from the substrate electrode 816 by a distance selected on a wavelength of light to be modulated, for example, a distance of about 2.4 μm.

Referring to FIG. 8, the structure can be modeled as a simple parallel-plate capacitor with an upper electrode on the light modulating micro-ribbon, and a lower electrode on the substrate. The effects of the presence of the hidden-ribbon in the gap are minor and can be ignored for purposes of this modeling. The electrostatic force is transferred to a spring structure in the hidden-ribbon via a central post coupling to the overlying micro-ribbon. It is noted that applying all the force in the center of the spring structure gives twice the deflection of the same force distributed over the length of the micro-ribbon. This leads to the following equation for snap-down voltage (V):

$$V = \sqrt{\frac{8g_0^3 \cdot k}{27A\varepsilon}}$$

where $g_0$ is the initial gap (~2.4 μm), A is the area equal to b*L, L is the-ribbon length, b is the-ribbon width, and & is the electric constant (in vacuum), and k is the spring constant. The spring constant is given by:

$$k = \frac{\sigma \cdot h \cdot b}{4L}$$

where σ is stress modulus of $Si_3N_4$ (~800 MPA), b is the hidden-ribbon width h is the thickness of the hidden-ribbon and L is the length of the hidden-ribbon. Combining these equations it is found the thickness and length, width falls out, and the relationship between snap-down voltage and -ribbon geometry can be found by the following equation:

$$V = \sqrt{\frac{8g_0^3 \cdot \frac{\sigma \cdot h \cdot b}{4L}}{27A\varepsilon}} = \sqrt{\frac{2g_0^3 \cdot \frac{\sigma \cdot h \cdot b}{4L}}{27b \cdot L \cdot \varepsilon}} = \sqrt{\frac{2g_0^3}{27bL^2}}$$

Figure 9:
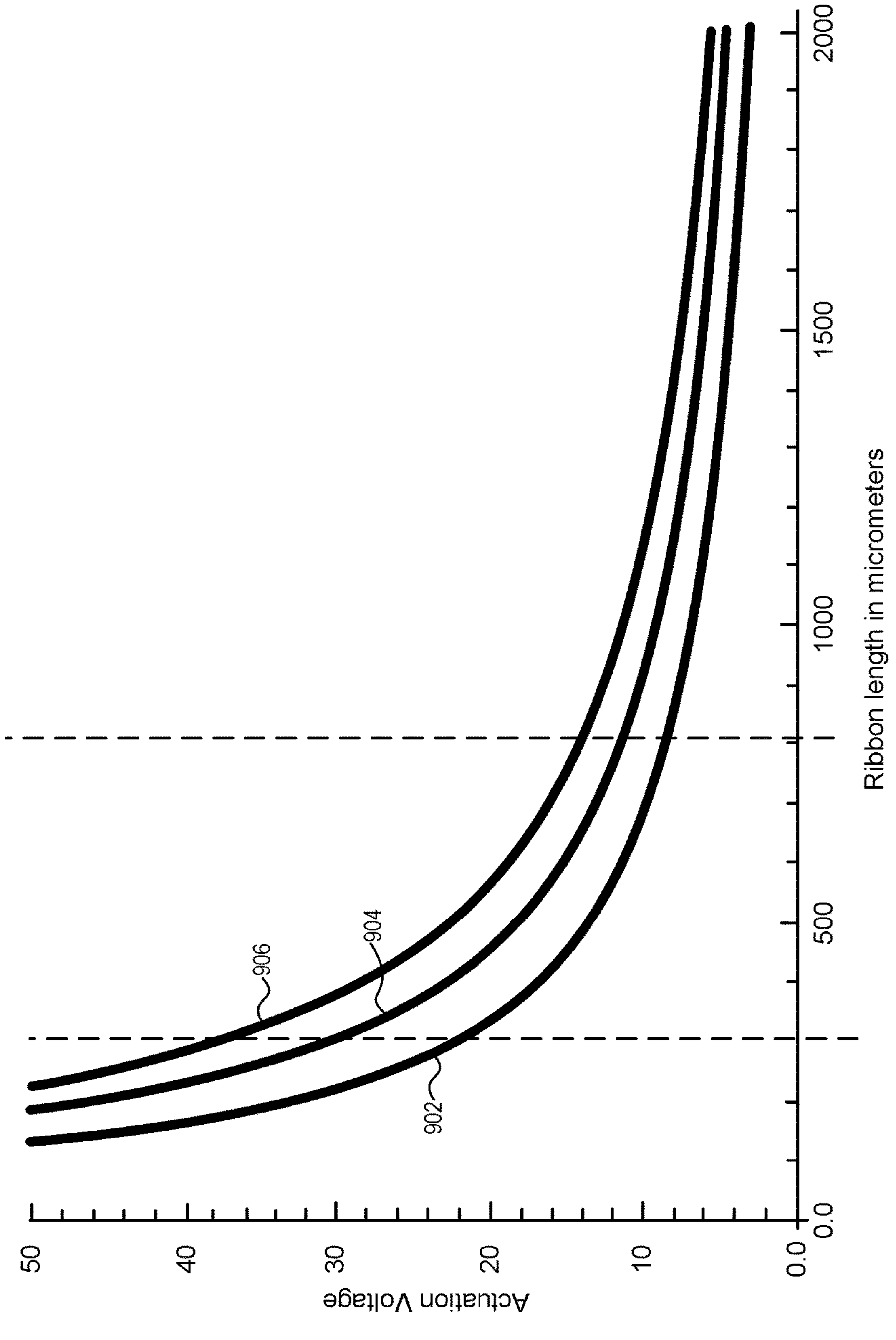
FIG. 9 is a graph of actuation voltage as a function of a length of hidden-ribbons of a spring structure for various thicknesses of the hidden-ribbons.

FIG. 9 is a graph of actuation voltage as a function of a length of hidden-ribbons of a spring structure for various thicknesses of the hidden-ribbons having a stress modulus of about 180 GPa, and a dual-layer micro-ribbon MEMS light modulator having an initial gap ($g_0$) of about 2.4 μm. Referring to FIG. 9 line 902 represents a hidden-ribbon thicknesses of 100 nm, line 904 represents a hidden-ribbon thicknesses of 200 nm, and line 906 represents a hidden-ribbon thicknesses of 300 nm. Thus, for an actuation voltage of between 10 and 40 volts, typically used in-ribbon-type MEMS light modulators, -ribbon lengths of between 50 and 100 μm are possible.

Figure 10A:
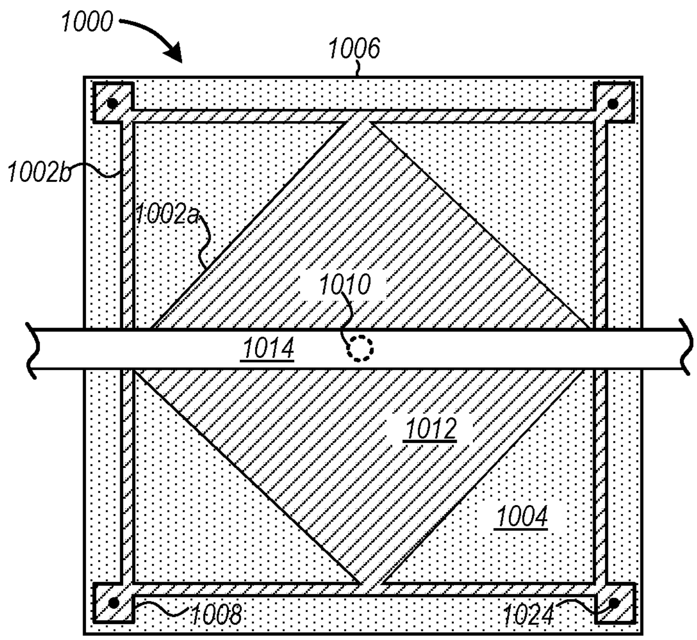
FIG. 10A is a simplified schematic diagram illustrating a top view of a two-dimensional (2D) actuator suitable for use as a spring structure in a dual-layer micro-ribbon MEMS light modulator.
Figure 10B:
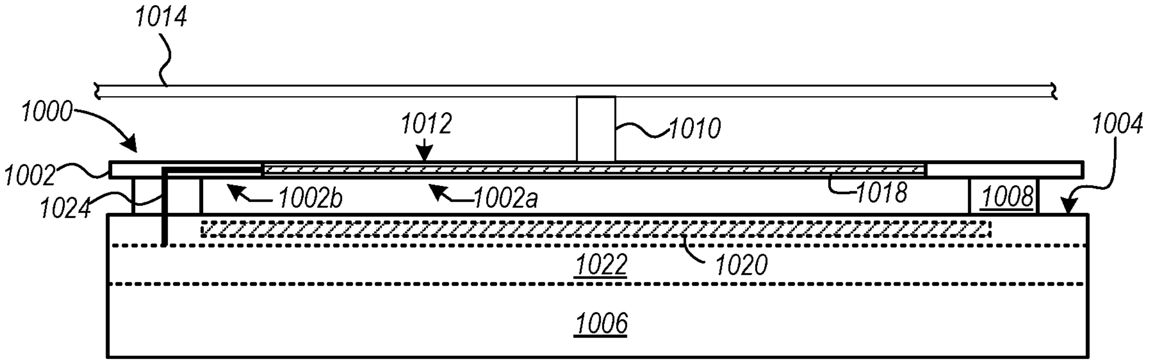
FIGS. 10B and 10C are simplified schematic diagrams illustrating a sectional side view of the 2D actuator of FIG. 10A in an undeflected and deflected state, respectively.

FIG. 10A is a top view of a two-dimensional (2D) actuator 1000 suitable for use as a spring structure in a dual-layer micro-ribbon MEMS light modulator, and FIG. 10B is a sectional side view of the 2D actuator in a quiescent or undeflected state. One such 2D actuator is a Planar Light Valve (PLV™) commercially available from Silicon Light Machines, Inc., of San Jose, California. Referring to FIGS. 10A and 10B, the 2D actuator 1000 includes a deformable membrane 1002 suspended over an upper surface 1004 of a substrate 1006 by first posts 1008 at corners thereof. The deformable membrane 1002 includes a deflectable patterned central portion (CP 1002*a*) and a number of flexures 1002*b* through which the CP is coupled to the posts 1008. The 2D actuator 1000 further includes a second or central post 1010 on a top surface 1012 of the CP 1002*a* on which a micro-ribbon 1014 (only a portion of which is shown in this figure) can be supported.

In operation displacement or deflection of the CP 1002*a* is accomplished by electrostatic forces generated between an actuator electrode 1018 formed in or on the CP and a substrate electrode 1020 in the substrate 1006. As with embodiments of the dual-layer micro-ribbon MEMS light modulator described above, the actuator electrode 1018 and substrate electrode 1020 can include a layer of metal or a semiconducting material, such as silicon-germanium (SiGe) formed in or on the CP 1002*a* and upper surface 1004 of the substrate 1006, respectively. Generally, the substrate electrode 1020 is coupled to one of a number drive channels in a drive circuit or driver 1022, which can be integrally formed in the substrate 1006 underlying the 2D actuator 1000, as in the embodiment shown or adjacent thereto. The actuator electrode 1018 can also be coupled to the driver 1022 or to an electrical ground through a conductor 1024 extending through one or more of the posts 1008 and the deformable membrane 1002. Typically, the actuator electrode 1018 is grouped or ganged together with an actuator electrode in at least one other 2D actuator 1000 supporting a single micro-ribbon 1014 a dual-layer micro-ribbon MEMS light modulator under control of a single drive channel to enable the micro-ribbon 1014 to move continuously and vertically relative to the upper surface 1004 of the substrate 1006 while maintaining the micro-ribbon substantially parallel to other micro-ribbons in the dual-layer micro-ribbon MEMS light modulator and the upper surface of the substrate.

Alternatively or additionally, as in the embodiments of the dual-layer micro-ribbon MEMS light modulator described above, the actuator electrode 1018 can be formed in or on the micro-ribbon 1014 supported the 2D actuator 1000 forming the spring structure.

Figure 10C:
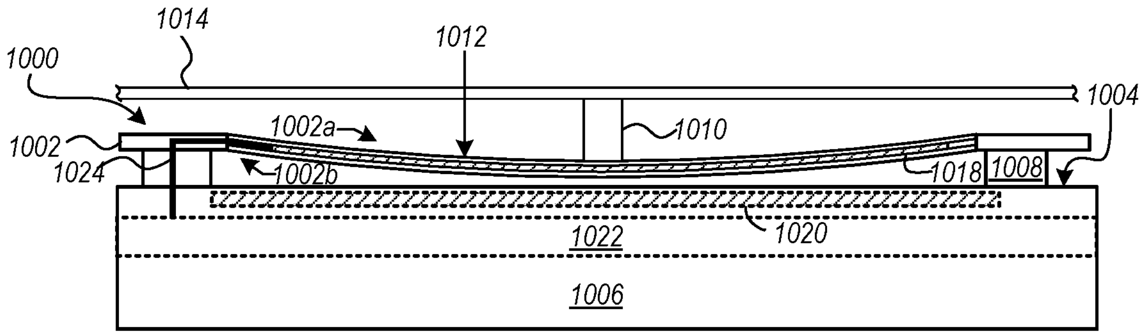

FIG. 10C is a simplified schematic diagram illustrating a sectional side view of the 2D actuator of FIG. 10B in an active or deflected state. It is noted that unlike the micro-ribbon 1014, the CP 1002*a* deforms into a curved surface as it is displaced or actuated.

Figure 11A:
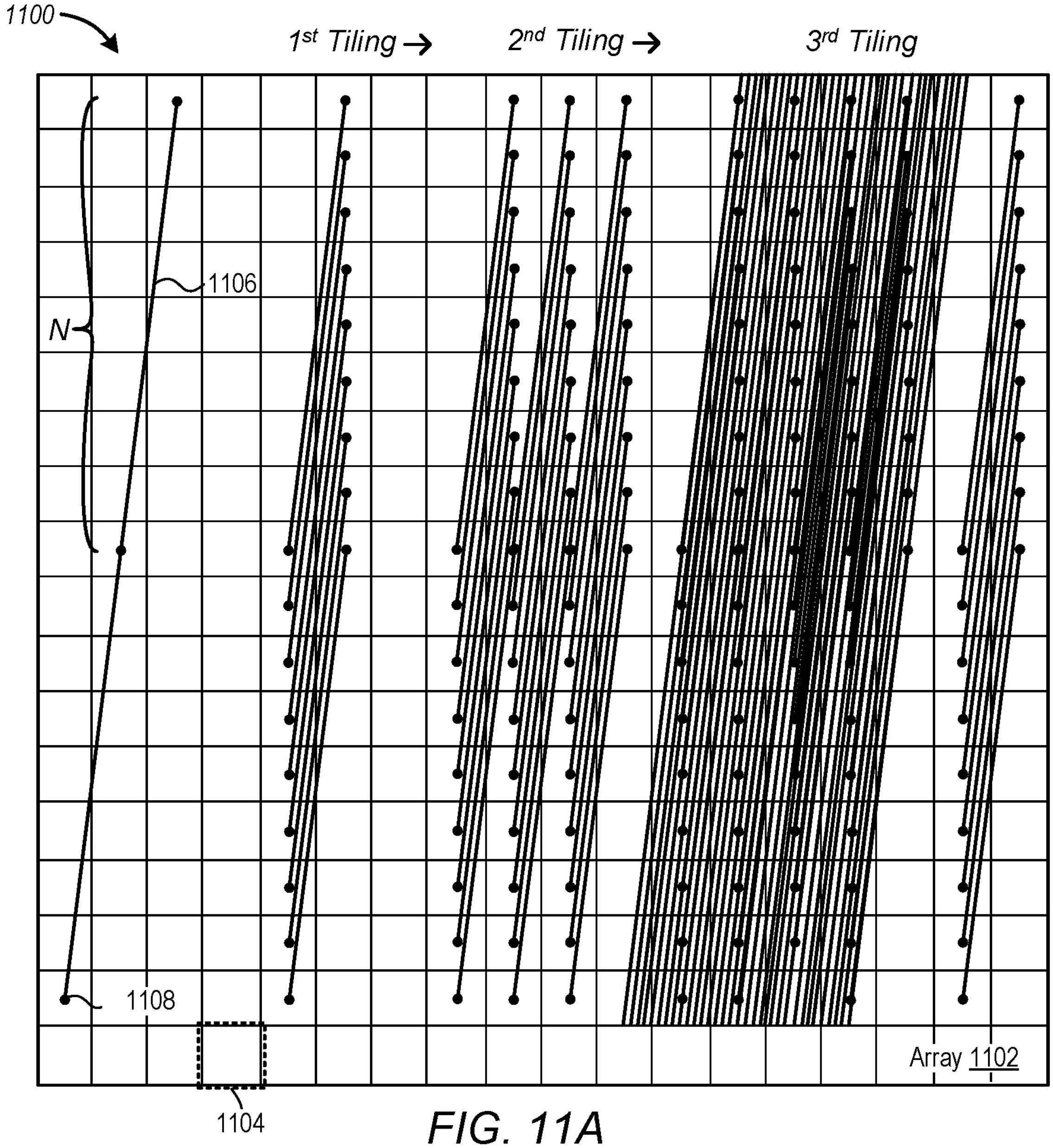
FIG. 11A is a simplified schematic diagram illustrating a top view of a dual-layer micro-ribbon MEMS light modulator in which a lower actuating layer includes an array of 2D actuators arranged in rows and columns, and where long axes of the micro-ribbons are angled relative to the rows and columns.

FIG. 11A is a simplified schematic diagram illustrating a top view of a dual-layer micro-ribbon MEMS light modulator 1100 in which a lower actuating layer includes an array 1102 of 2D actuators 1104 arranged in rows and columns, with light modulating micro-ribbons 1106 are supported above the 2D actuators 1104 by a number of central posts 1108. The long axes of the light modulating micro-ribbons 1106 are angled relative to the rows and columns, to enable a spacing or pitch between the micro-ribbons to independent of and much narrower than that of the 2D actuators 1104.

Referring to FIG. 11A it is seen the dual-layer micro-ribbon MEMS light modulator 1100 has a post skew ratio 1/N that reduces a pitch of the light modulating micro-ribbons 1106 by about P/N, where P is the pitch in micrometers between central posts 1108 along rows of the array 1102, and N is the spacing or pitch between adjacent central posts on a micro-ribbon along columns of the array. For example, a P of 32 μm, and an N of 16 the dual-layer micro-ribbon MEMS light modulator 1100 will have a 2 μm pitch for any arbitrary length of light modulating micro-ribbons 1106. Additionally, it is noted that this embodiment provides excellent damping due to wide 2D actuators 1104, obviating the need for any damping structures. Finally, this embodiment using 2D actuators 1104, has larger actuator electrodes which can be driven at voltages of less than about 50V, and can use low stress SiGe (25 MPa) for the actuating layer, simplifying both fabrication of the dual-layer micro-ribbon MEMS light modulator 1100.

Figure 11B:
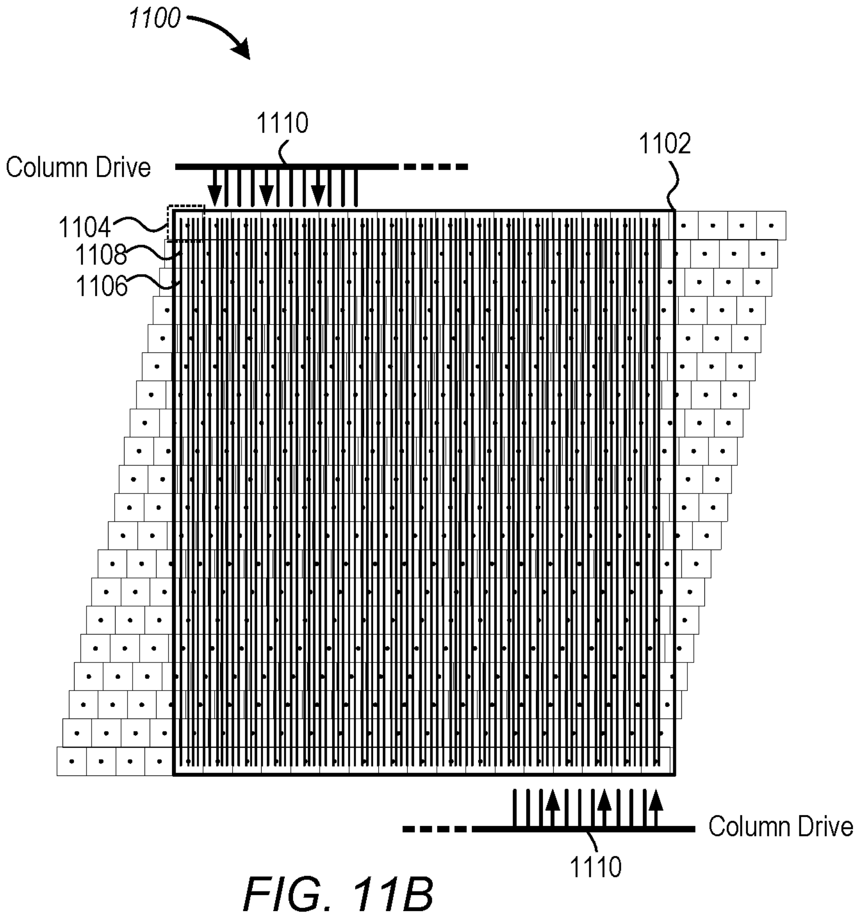
FIG. 11B is a simplified schematic diagram illustrating an embodiment of the dual-layer micro-ribbon MEMS light modulator of FIG. 11A in which the rows of the array of 2D actuators are offset.

FIG. 11B is a simplified schematic diagram illustrating a top view of another embodiment dual-layer micro-ribbon MEMS light modulator 1100 in which a lower actuating layer includes an array 1102 of 2D actuators 1104 arranged in rows and columns, with light modulating micro-ribbons 1106 are supported above the 2D actuators 1104 by a number of central posts 1108. Each row of 2D actuators 1104 is offset from adjacent rows to enable spacing or pitch between the micro-ribbons to be independent of and much narrower than that of the 2D actuators 1104.

Referring to FIG. 11B it is seen that each row of pistons is offset along the short axes of the light modulating micro-ribbons 1106 by an amount that is equal to the pitch of the light modulating micro-ribbons. The pitch of the 2D actuators 1104 along the short axes of the light modulating micro-ribbons 1106 is such that P=R*F, where P is the pitch in micrometers between central posts 1108 along the short axes of the light modulating micro-ribbons, R is the pitch of the light modulating micro-ribbons and F is the posting frequency along the long axes of the light modulating micro-ribbons for each micro-ribbon. For example, a P of 32 μm, and an F of 8 (micro-ribbon is posted once every 8 central posts along the long axes of the light modulating micro-ribbons), the dual-layer micro-ribbon MEMS light modulator 1100 will have a 4 μm pitch for any arbitrary length of light modulating micro-ribbons 1106. Additionally, it is noted that this embodiment provides excellent damping due to wide 2D actuators 1104, obviating the need for any damping structures. This embodiment using 2D actuators 1104, has larger actuator electrodes which can be driven at voltages of less than about 50V, and can use low stress SiGe (25 MPa) for the actuating layer, simplifying both fabrication of the dual-layer micro-ribbon MEMS light modulator 1100. Finally, this embodiment the 2D actuators 1104 are driven by a number column drives 1110. The column drives 1110 enable the dual-layer micro-ribbon MEMS light modulator 1100 to be operated to produce a repeating "blaze" pattern, which is particularly useful in beam steering applications, discussed in greater detail below.

Figure 11C:
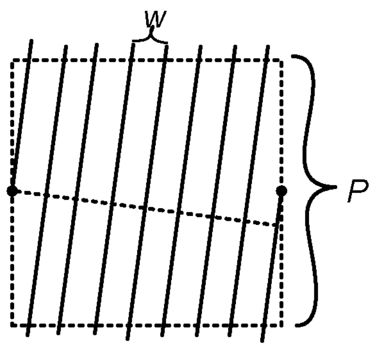
FIG. 11C is a simplified schematic diagram illustrating a pitch of micro-ribbons in the dual-layer micro-ribbon MEMS light modulator of FIG. 11A or 11B.

FIG. 11C is a simplified schematic diagram illustrating a pitch (w) of the light modulating micro-ribbons 1106 in the dual-layer micro-ribbon MEMS light modulator of FIG. 11A or 11B as a function of is the pitch (P) in micrometers between central posts 1108 along rows of the array 1102, and the spacing or pitch (N) between adjacent central posts along columns of the array.

$$w = P/\sqrt{I + N^2}$$

Figure 12:
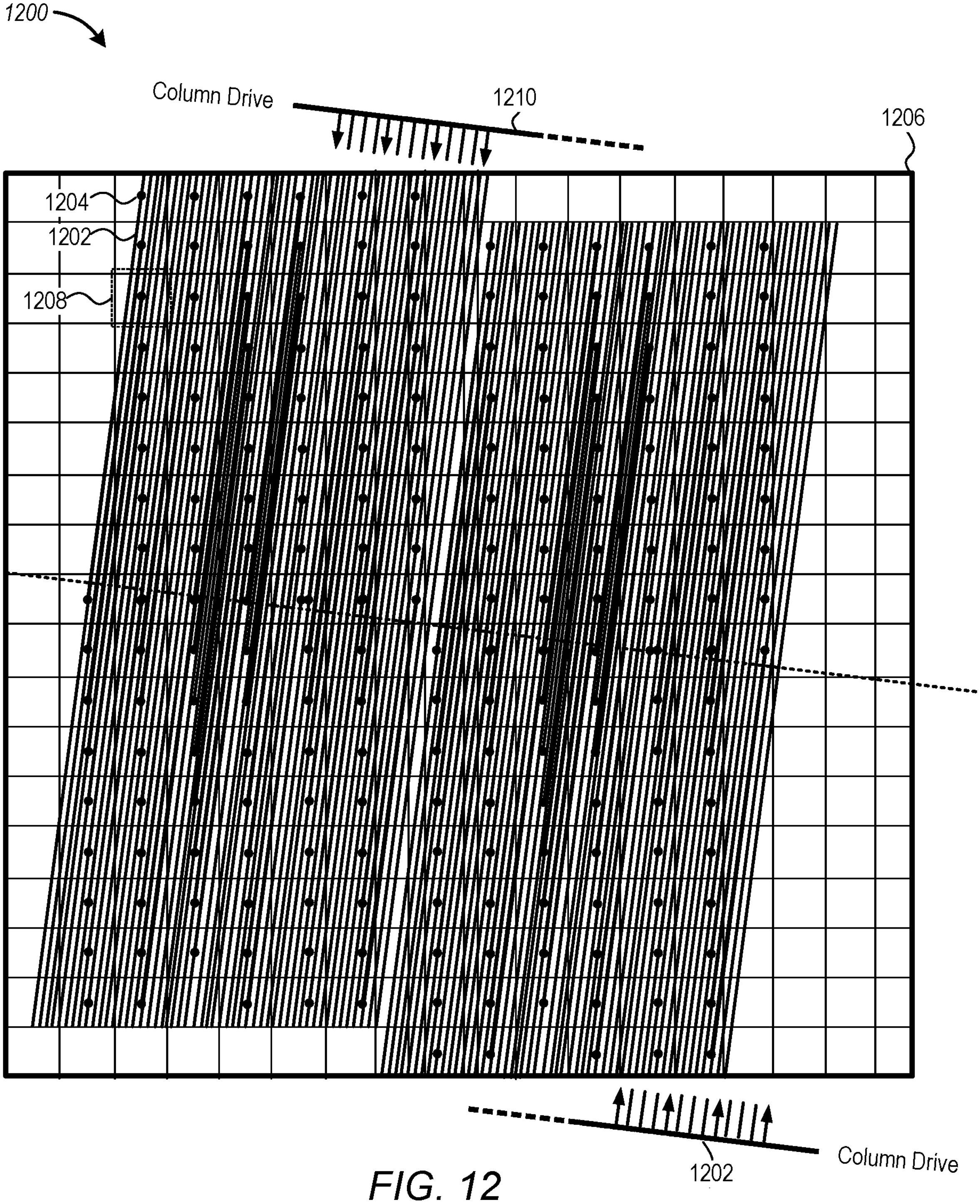
FIG. 12 is a simplified schematic diagram illustrating another embodiment of the dual-layer micro-ribbon MEMS light modulator of FIG. 11A driven by a number of column-drives.

FIG. 12 is a simplified schematic diagram illustrating the dual-layer micro-ribbon MEMS light modulator 1200 similar to that of FIG. 11A in which the light modulating micro-ribbons 1202 are supported by central posts 1204 above an array 1206 of 2D actuators 1208 at an angle relative to rows and columns of the array, and are driven by a number column drives 1210 as described with respect to FIG. 11B to produce the repeating "blaze" pattern.

Figure 13:
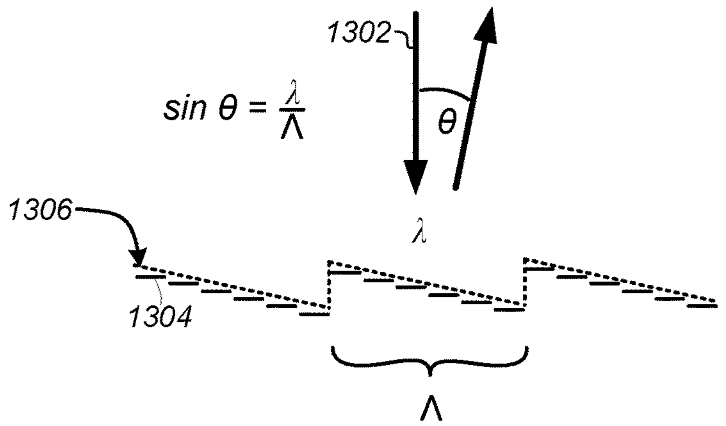
FIG. 13 is a schematic representation of pitch and amplitude of a number of individual micro-ribbons of a dual-layer micro-ribbon MEMS light modulator to provide beam steering.

FIG. 13 is a schematic representation of how the pitch and amplitude of an ensemble of micro-ribbons in a reflective dual-layer micro-ribbon MEMS light modulator can be adjusted to form or function as a phased-array to steer a beam of light. Referring to FIG. 13, in order to steer a normally incident beam 1302 through a reflected steering angle θ, micro-ribbons 1304 are arranged in a "blaze" pattern (shown by dashed line 1306) of pitch or period Λ. As the blaze pitch Λ is reduced, light is steered over larger angles θ. Note that the blaze period Λ can assume integer or non-integer values to allow continuous modulation of the steering angle θ. The largest steering angle is achieved when the blaze period comprises two micro-ribbons.

Figure 14:
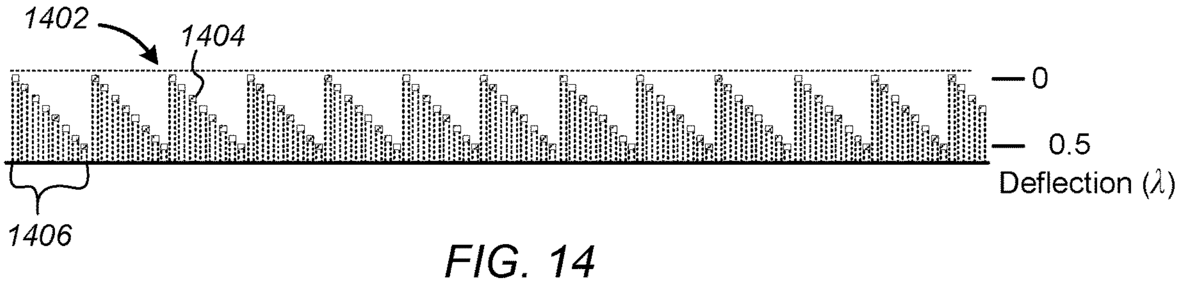
FIG. 14 is a schematic representation of pitch and amplitude of portion of a dual-layer micro-ribbon MEMS light modulator arranged in a blaze pattern.

FIG. 14 is a schematic representation of a portion of a dual-layer micro-ribbon MEMS light modulator 1402 shown in cross-section to long axes of the micro-ribbons 1404 in which the micro-ribbons are arranged in a blaze pattern. The deflection of the micro-ribbons 1404 is varied to impart a monotonic phase variation along the array. Note that once the phase variation exceeds one wave (i.e. half wave deflection), the deflection pattern is continued via modulo division by the wavelength forming the blaze groupings 1406. A dual-layer micro-ribbon MEMS light modulator 1402 with programmable MEMS elements (micro-ribbons 1404) allow light to be continuously scanned in angle, making it particularly useful in steering applications, such as light direction and ranging (LiDAR).

Figure 15:
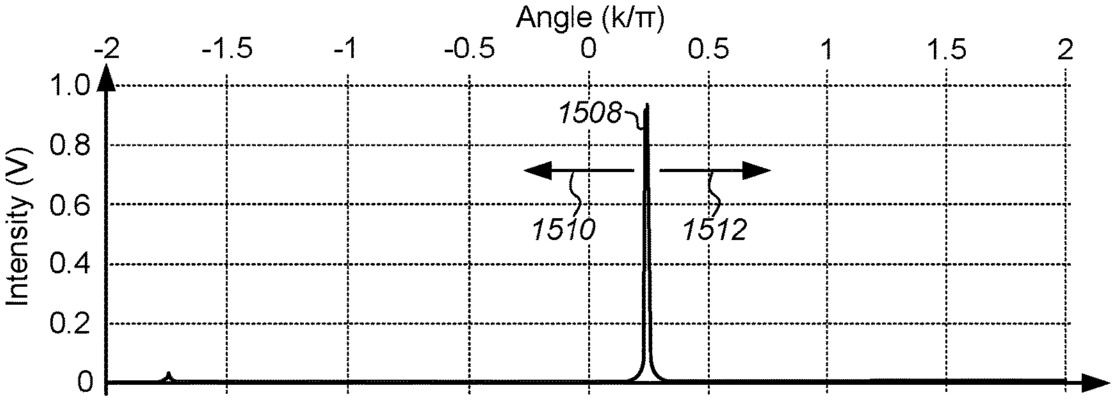
FIG. 15 is a graph of intensity versus steering angle for the modulator represented in FIG. 14, illustrating the suitability of the dual-layer micro-ribbon MEMS light modulator for applications requiring fast beam steering and large scan angles.

FIG. 15 is a graph of intensity versus steering angle and illustrates the suitability of a reflective dual-layer micro-ribbon MEMS light modulator represented schematically in FIG. 14 for phased-array and/or steering applications requiring fast beam steering and large scan angles. Referring to FIG. 15, it is seen that the periodic spatial pattern along the dual-layer micro-ribbon MEMS light modulator shown in FIG. 14 creates a phased-array reflection, while varying the spatial period and amplitude of the pattern changes the reflected beam angle, allowing the dual-layer micro-ribbon MEMS light modulator to rapidly cycle through patterns to scan or sweep beam across an imaging plane or far field scene. In particular, it is noted that as the period of the spatial pattern on the dual-layer micro-ribbon MEMS light modulator 1402 increases, i.e., as each period includes a greater number of micro-ribbons, a maximum intensity 1508 with which light is reflected from the dual-layer micro-ribbon MEMS light modulator 1402 shifts to the left as indicated by arrow 1510. As spatial period decreases or the number of micro-ribbons in each period reduced, the maximum intensity 1508 with which light is reflected from the dual-layer micro-ribbon MEMS light modulator 1402 shifts to the right as indicated by arrow 1512.

The large field of view and high power handling capability of the dual-layer micro-ribbon MEMS light modulator along with the high switching speed of the-ribbon-type light modulators makes it attractive for MEMS phased-array applications such as LiDAR.

Figures 16, 17:
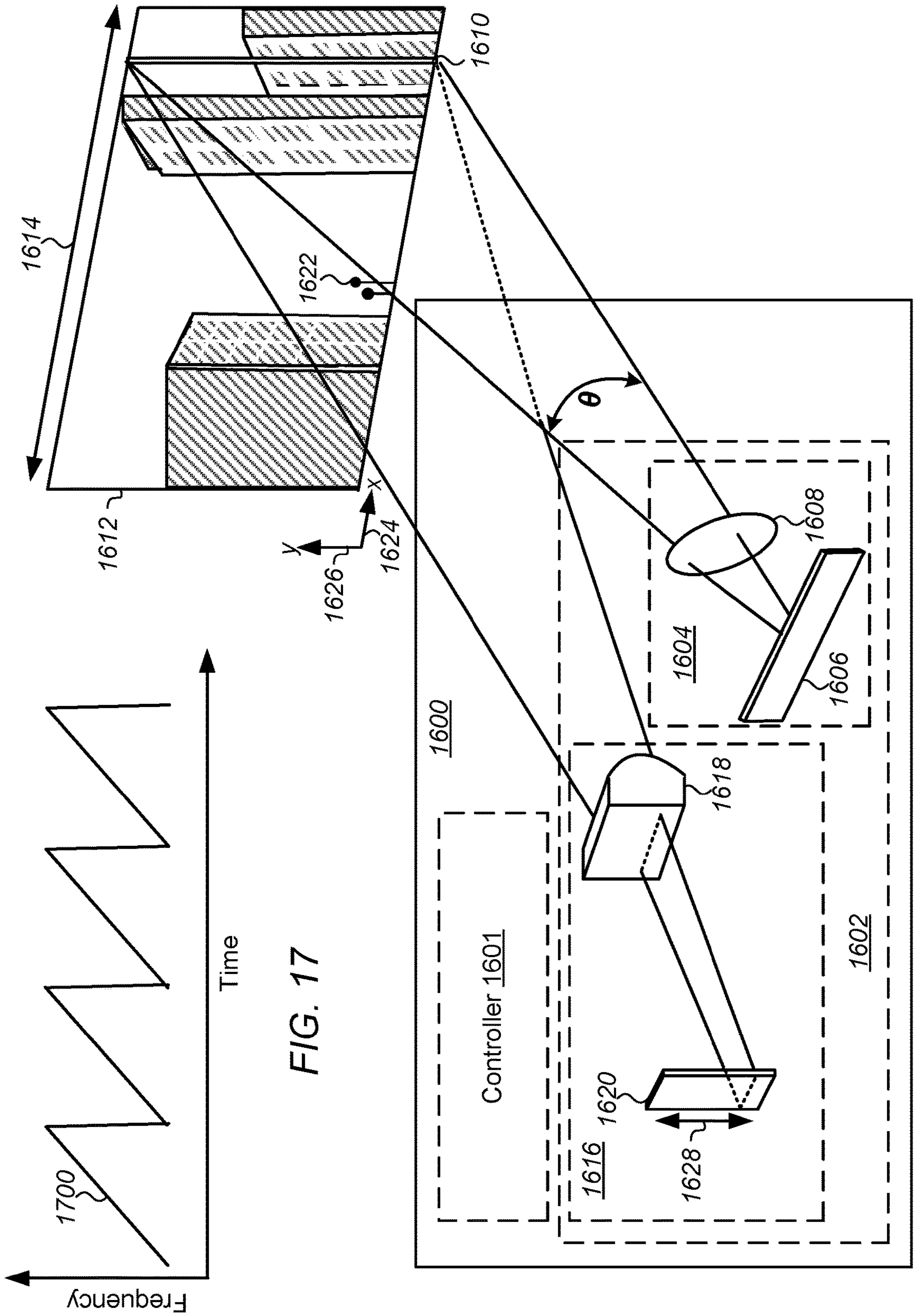
FIG. 16 is a schematic diagram of a Light Detection and Ranging (LIDAR) system including an optical system with a dual-layer micro-ribbon MEMS light modulator.
FIG. 17 is a diagram illustrating a change in frequency of an outgoing pulse over time for a LiDAR system using a frequency modulated continuous wave (FMCW) technique.

A method of operating a LiDAR system including a dual-layer micro-ribbon MEMS light modulator configured or operable to function as a MEMS phased-array to scan a far field scene will now be described with reference to FIG. 16. FIG. 16 is a schematic functional diagram of a portion of a LiDAR system 1600 including controller 1601 and a solid state optical scanner 1602 having an optical transmitter 1604 with at least one dual-layer micro-ribbon MEMS light modulator 1606 configured to receive light from a light source through shaping or illumination optics (not shown in this figure), and to modulate phases of at least some of the received light and transmit or project a beam of phase modulated light through projection optics 1608 to steer a line or swath 1610 of illumination to scan a far field scene 1612. The dual-layer micro-ribbon MEMS light modulator 1606 steers the beam of light to scan the far field scene 1612 by changing phase modulation of light incident on different portions of the dual-layer micro-ribbon MEMS light modulator. Generally, the first dual-layer micro-ribbon MEMS light modulator 1606 is configured to scan the far field scene 1612 in at least two dimensions, including an angular dimension (θ), and an axial dimension (indicated by arrow 1614) parallel to a long axis of the dual-layer micro-ribbon MEMS light modulator.

It is noted that although the optical scanner 1604 is shown schematically as including a single dual-layer micro-ribbon MEMS light modulator 1606 this need not and generally is not the case in every embodiment. Rather, as explained in detail below, it is often advantageous that the optical scanner 1604 include multiple adjacent dual-layer micro-ribbon MEMS light modulators 1606 operated in unison or a single dual-layer micro-ribbon MEMS light modulator having multiple adjacent arrays to increase either aperture width or length to increase a power or radiant flux of the transmitted or received light and to increase the point spread resolution of the system.

The optical scanner 1604 further includes an optical receiver 1616 including collection or receiving optics 1618 to capture light from the far field scene 1612, which is then directed onto a detector 1620.

Referring to FIG. 16, depth or distance information from the LiDAR system 1600 to a target or object 1622 in the far field scene 1612 can be obtained using any one of a number of standard LiDAR techniques, including pulsed, amplitude-modulated-continuous-wave (AMCW) or frequency-modulated-continuous-wave (FMCW). In pulsed and AMCW LiDAR systems the amplitude of intensity of the light transmitted is either pulsed or modulated with a signal, and the TOF from the LiDAR system 1600 to the object 1622 is obtained by measuring the amount by which the return signal is time-delayed. The distance to the reflected object is found by multiplying half this time by the speed of light.

FIG. 17 is a diagram illustrating a change in frequency of an outgoing pulse of transmitted light over time for a LiDAR system using an FMCW technique. Referring to FIGS. 16 and 17, in a FMCW LiDAR the frequency of an outgoing chirp or pulse 1700 of transmitted light is continuously varied over time as the swath 1610 of light is continuously scanned across the far field scene 1612. The time to the object 1622 can be determined by comparing the frequency of light reflected from the object to that of a local oscillator, and the distance to the object is found by using the speed of light as previously described. FMCW LiDAR systems have an advantage over amplitude modulated in that the local oscillator provides an inherent amplification of the detected signal.

With information on TOF the controller 1601 in the LiDAR system can then calculate a location of the object 1622 in the far field scene 1612 along an X-axis 1624 from the steering direction of the dual-layer micro-ribbon MEMS light modulator 1606 when the light was transmitted from the dual-layer micro-ribbon MEMS light modulator, and along a Y-axis 1626 from a sensed location of the object along an axis of the detector 1620 (indicated by arrow 1628) parallel to a long axis of the detector.

Embodiments of optical scanners including a dual-layer micro-ribbon MEMS light modulator according to the present disclosure, and which are particularly suitable for use in LiDAR systems to scan and/or identify objects or targets, such as people, buildings and automobiles, in a far field scene will now be described with reference to the block diagrams of FIGS. 18A and 18B.

Figure 18A:
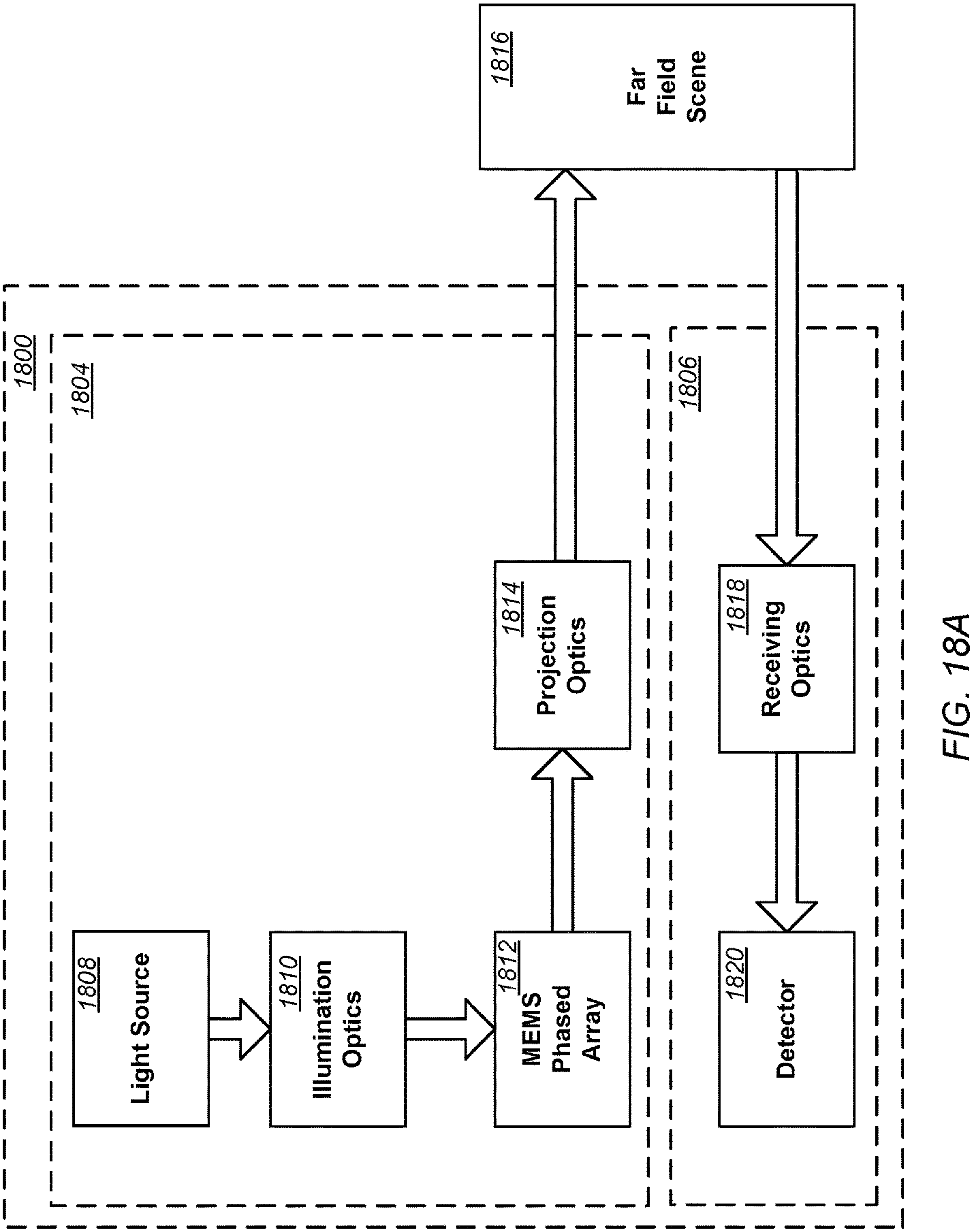
FIG. 18A is a block diagram illustrating an embodiment of an optical system including a dual-layer micro-ribbon MEMS light modulator in an optical transmitter of an optical scanner suitable for use in a LiDAR system.

Referring to FIG. 18A, in a first embodiment the optical scanner 1800 includes an optical transmitter 1804 and an optical receiver 1806. The optical transmitter 1804 generally includes a light source 1808, shaping or illumination optics 1810 to illuminate a dual-layer micro-ribbon MEMS light modulator 1812 with light from the light source, and imaging or projection optics 1814 to transmit or project phase modulated light from the dual-layer micro-ribbon MEMS light modulator into a far field scene 1816 to scan the far field scene in at least two dimensions.

The light source 1808 can include any type and number of light emitting devices capable of continuously emitting or pulsing a coherent light at a sufficient power level or power density, and at a single wavelength or frequency, or within a narrow range of wavelengths or frequencies, to enable light from the dual-layer micro-ribbon MEMS light modulator 1812 to be modulated in phase and/or amplitude. Generally, the light source 1808 is a continuous-wave light source that continuously emits a light that is modulated either in amplitude, for an AMCW LiDAR, or in frequency, for a FMCW LiDAR. Because objects in the far field scene are continuously illuminated; the light source can operate with less power compared to a high peak-power of pulsed systems. The light source 1808 can include a number of lasers or laser emitters, such as diode lasers, vertical-cavity surface-emitting lasers (VCSELS). In one embodiment the light source 1808 includes a VCSEL array having a number of laser emitters to increase optical power while meeting or extending an eye-safe power limit. In another embodiment, the light source 1808 includes a number of high-power lasers producing from about 5000 to about 40,000 milliwatts (mW) of power at a wavelength ($\lambda$) of from about 750 to about <2000 nm.

The illumination optics 1810 can comprise a number of elements including lens integrators, mirrors and prisms, configured to transfer light from the light source 1808 to the first dual-layer micro-ribbon MEMS light modulator 1812 to illuminate a line of a specified width and covering substantially a full width and/or length of the dual-layer micro-ribbon MEMS light modulator. In one embodiment, the illumination optics 1810 includes a microlens or lenticular array (not shown) to individually illuminate one or more modulators in the first dual-layer micro-ribbon MEMS light modulator 1812.

The projection optics 1814 can also include lenses, integrators, mirrors and prisms, and are configured to transfer light from the dual-layer micro-ribbon MEMS light modulator 1812 to illuminate a line or swath in the far field scene 1816. Generally, the projection optics 1814 includes magnifying optics or elements, such as Fourier Transform (FT) lenses and mirrors, to increase a field of view (FOV) of the optical scanner 1800. In one embodiment, the projection optics 1814 include a lenticular array to disperse the light in a first direction to form the swath of illumination perpendicular to a direction over which the projected light is moved or steered in the far field scene 1816.

The optical receiver 1806 generally includes receiving optics 1818 to collect or receive light from the far field scene and direct or pass the received light onto a detector 1820 or detector array. Like the illumination and projection optics the receiving optics 1818 can include lenses, integrators, mirrors and prisms, and are configured to receive and transfer light from the far field scene 1816 to the onto the detector 1820. In one embodiment, the receiving optics 1818 includes a lenticular array to increase an effective fill factor of the detector 1820.

Generally, the detector 1820 can comprise any type of detector sensitive to light in the wavelengths generated by the light source 1808, including a rolling shutter camera or cameras, a one or two dimensional array of photodiode detectors, or a single photon avalanche diode (SPAD) array. In the embodiment shown in FIG. 18A, the receiving optics will be 2D, and the detector is a 2D array of detectors or a 2D detector array. LiDAR systems used in automobiles detector 1820 can use lower density, higher sensitivity devices, such as avalanche photo-diodes (APDs), for long range detection.

Figure 18B:
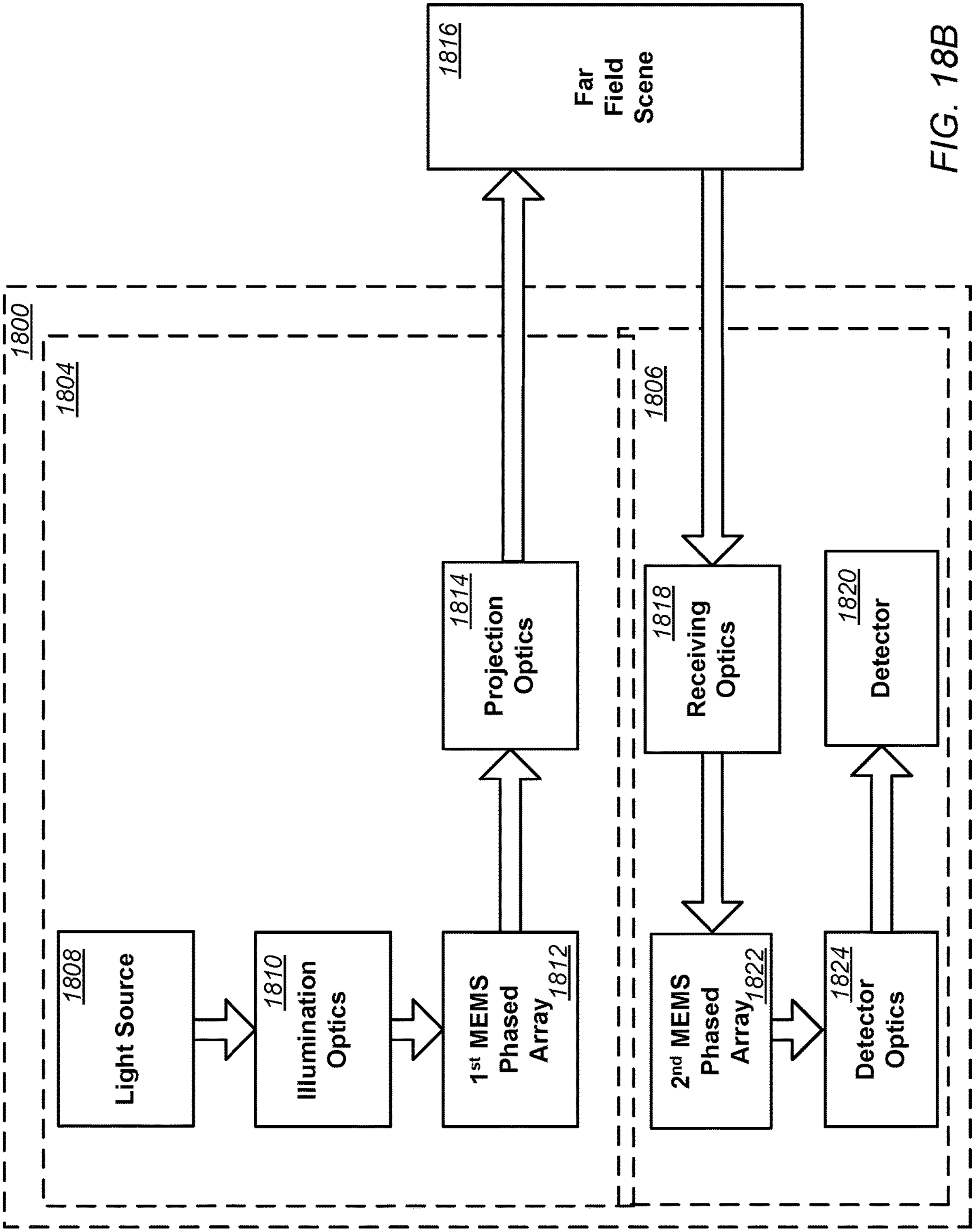
FIG. 18B is a block diagram illustrating another embodiment of the optical system of FIG. 18A including a 1$^{st}$ dual-layer micro-ribbon MEMS light modulator in an optical transmitter and a 2$^{nd}$ dual-layer micro-ribbon MEMS light modulator in an optical receiver of the optical scanner.

In another embodiment, shown in FIG. 18B, the optical receiver 1806 is a pointing optical receiver including a 2nd dual-layer micro-ribbon MEMS light modulator 1822 to de-scan collected or received light by selectively directing light reflected from a slice of the far field scene 1816 onto the detector 1820 while substantially rejecting background light. For example, the 2nd dual-layer micro-ribbon MEMS light modulator directs the light from the light source reflected from the far field scene 1816 onto the detector 1820 by adapting the direction to which it steers light based on information on the direction to which the 1st dual-layer micro-ribbon MEMS light modulator 1812 steers the light-beam. Optionally, as in the embodiment shown the optical receiver 1806 can further include detector optics 1824 to transfer light from the $2^{nd}$ dual-layer micro-ribbon MEMS light modulator 1822 on to the detector 1820. As with the illumination optics 1810, projection optics 1814 and receiving optics 1818, the detector optics 1824 can include lenses, integrators, mirrors and prisms, and configured to substantially fill or over fill the detector 1820. In one embodiment, the receiving optics 1818 includes a lenticular array to increase an effective fill factor of a stacked phased-array 1822.

In some embodiments in which the wherein the detector 1820 includes a one dimensional (1D) detector array, and the optical receiver 1806 is a pointing-receiver in which the $2^{nd}$ dual-layer micro-ribbon MEMS light modulator 1822 selectively directs light reflected from a slice of far field scene 1816 onto the 1D detector array while rejecting light reflected from the far field scene outside of the slice and background light.

As with the embodiment shown in FIG. 18A the optical scanner 1800 includes an optical transmitter 1804 and an optical receiver 1806. The optical transmitter 1804 additionally includes the light source 1808 and illumination optics 1810 to illuminate the $1^{st}$ dual-layer micro-ribbon MEMS light modulator 1812 with light from the light source and projection optics 1814 to transmit or project phase modulated light from the dual-layer micro-ribbon MEMS light modulator into the far field scene 1816. The optical receiver 1806 includes in addition to the $2^{nd}$ dual-layer micro-ribbon MEMS light modulator 1822 the detector 1820 and receiving optics 1818 to collect or receive light from the far field scene 1816 and to direct or pass the light to the $2^{nd}$ dual-layer micro-ribbon MEMS light modulator 1822 and onto the detector 1820. As the $2^{nd}$ dual-layer micro-ribbon MEMS light modulator 1822 directs the light from the light source reflected from the far field scene onto the detector 1820, it is possible to reduce the size or width of the detector 1820, compared to the case in which the $2^{nd}$ dual-layer micro-ribbon MEMS light modulator 1822 is not provided. That is, because $2^{nd}$ dual-layer micro-ribbon MEMS light modulator 1822 is capable of imaging a slice of the 2D scene 1816 onto the detector 1820; the detector can include a 1D array detector. The full scene is reconstructed by scanning the $2^{nd}$ dual-layer micro-ribbon MEMS light modulator.

In yet another embodiment, not shown, the optical scanner 1800 includes a shared dual-layer micro-ribbon MEMS light modulator configured as a phased array to modulate phases of the light from a light source 1808 at a first time to scan a far field scene 1816, and at a second time to de-scan collected or received light by directing light from the light source reflected from the far field scene onto the detector 1820 while substantially rejecting background light.

Figure 19:
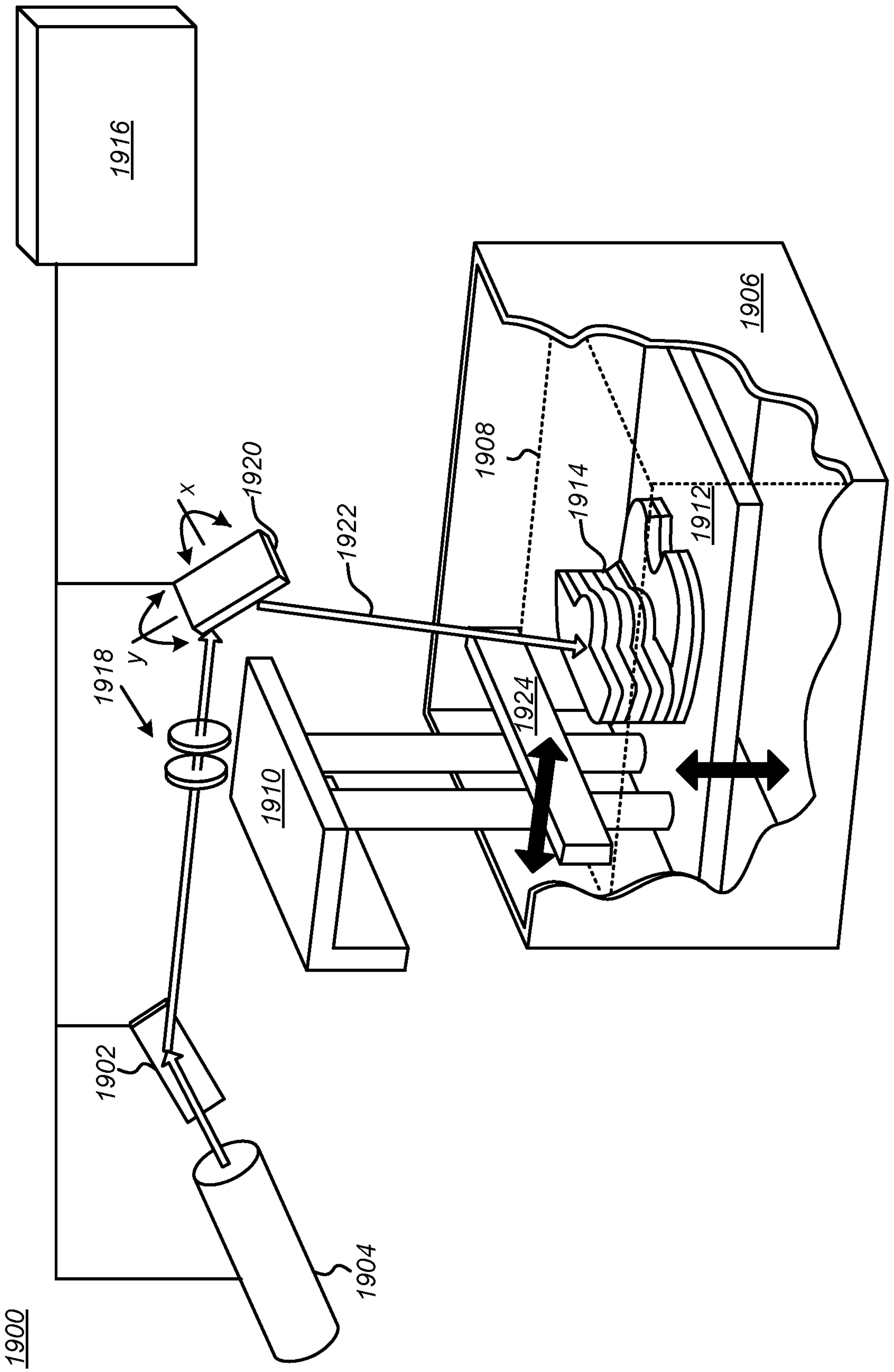
FIG. 19 is a schematic block diagram of an additive manufacturing system including a dual-layer micro-ribbon MEMS light modulator.

FIG. 19 is a schematic block diagram of a three-dimensional (3D) printing or additive manufacturing system including a dual-layer micro-ribbon MEMS light modulator enclosed in a package including a cavity filled with a low molar mass and high thermal conductivity fill gas. Referring to FIG. 19, the 3D printing system 1900 generally includes a dual-layer micro-ribbon MEMS light modulator 1902 with a number of pixels, each with multiple light modulating micro-ribbons to modulate a beam of light generated by a laser 1904, a vat 1906 containing the photopolymer or resin 1908 (indicated by dashed lines), and a transport mechanism 1910 to raise and lower a work surface 1912 on which an object 1914 is printed into the vat as indicated by the vertical arrow. The laser 1904 is preferably a high power laser capable of operating in UV wavelengths of from 355 nm through IR wavelengths up to about 1550 nm in either CW mode at powers of about 500 Watts (W) to greater than about 1 kilowatt (kW), or in a pulse mode with widths or durations of from about 1 fs up to about 500 ns at a repetition rate of from about 10 kHz up to about 300 kHz, and at energy ranges of from about 10 microjoules (μJ) up to greater than 10 millijoules (mJ).

Referring again to FIG. 19, the 3D printing system 1900 further includes imaging optics 1918 to transfer modulated light from the dual-layer micro-ribbon MEMS light modulator 1902 toward an imaging or focal plane on the work surface 1912, a controller 1916 to control operation of the laser 1904, dual-layer micro-ribbon MEMS light modulator and transport mechanism 1910. In some embodiments, the imaging optics 1918 can include magnification and filtering elements, such as a first Fourier Transform (FT) lens to focus and direct light from the dual-layer micro-ribbon MEMS light modulator 1902 onto a scanning mirror 1920 that rotates to scan a modulated beam 1922 along a x-axis and a y-axis on a surface of the resin 1908 immediately above or adjacent to the work surface 1912.

Figures 20A, 20B:
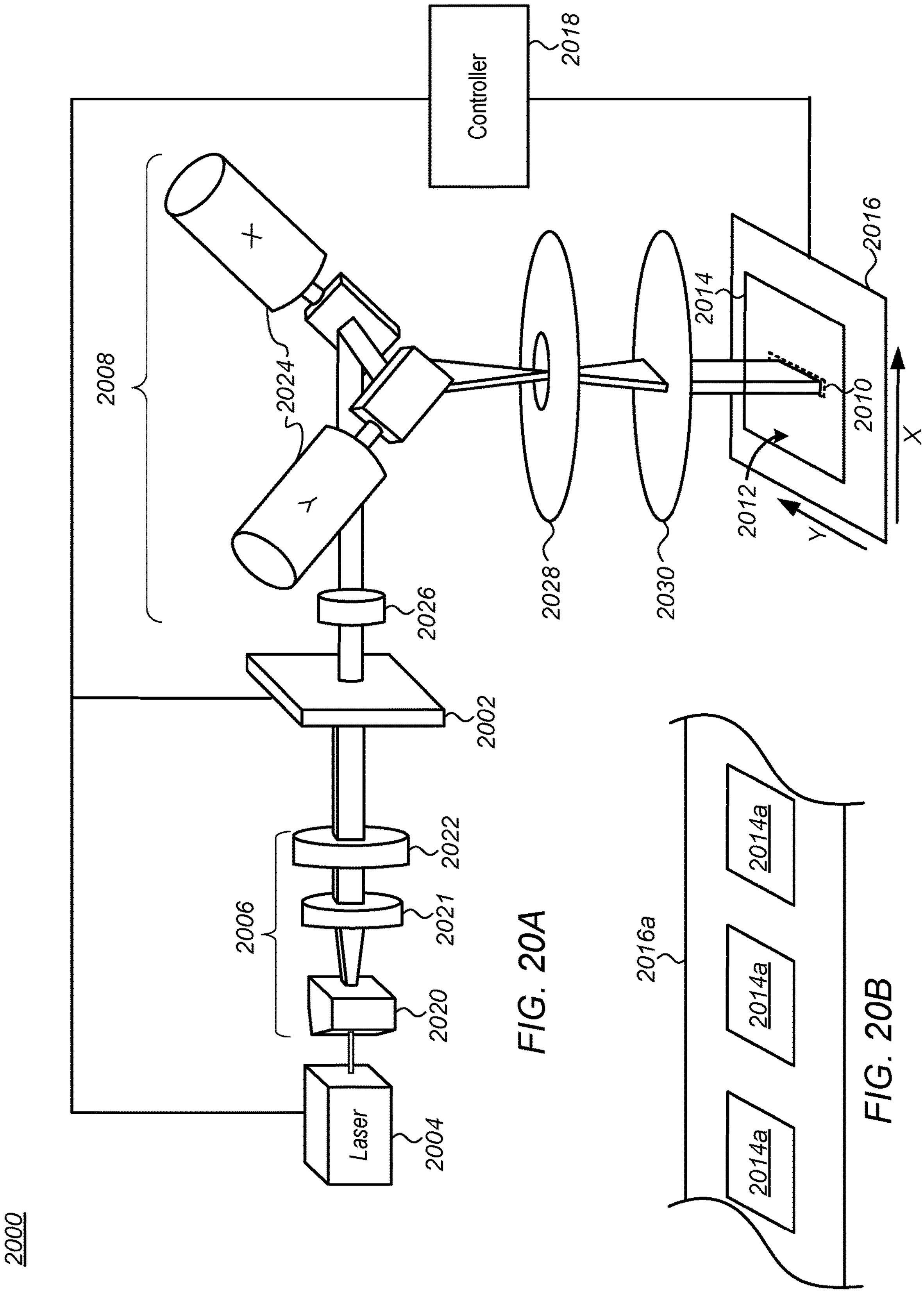
FIGS. 20A and 20B are schematic block diagrams of an embodiment of a laser marking system including a dual-layer micro-ribbon MEMS light modulator, and galvanometric mirrors for scanning.

The transport mechanism 1910 is adapted and controlled by the controller 1916 to lower the work surface 1912 into the vat 1906 as the modulated light converts the liquid resin 1908 into a solid, building successive layers or cross-sections of the object 1914 to be printed. Generally, the 3D printing system 1900 further includes a sweeper 1924 adapted to move as indicated by the horizontal arrow to spread or smooth fresh resin 1908 over surface sections of the object 1914 being printed or manufactured. FIG. 20A is a schematic block diagram of an embodiment of a laser marking system 2000 including a dual-layer micro-ribbon MEMS light modulator 2002 with a multi-pixel, linear array of MEMS based diffractors, and galvanometric mirrors for scanning. For purposes of clarity and to simplify the drawings the optical light path is shown as being unfolded causing the dual-layer micro-ribbon MEMS light modulator 2002 to appear as transmissive. However, it will be understood that when the dual-layer micro-ribbon MEMS light modulator 2002 is reflective the actual light path is folded to an angle of 90° or less at the dual-layer micro-ribbon MEMS light modulator.

Referring to FIG. 20A, the laser marking system 2000 includes, in addition to the dual-layer micro-ribbon MEMS light modulator 2002, a laser 2004 operable to generate laser light used to illuminate the dual-layer micro-ribbon MEMS light modulator, illumination optics 2006 to direct laser light onto the dual-layer micro-ribbon MEMS light modulator, imaging optics 2008 operable to focus a substantially linear swath of modulated light 2010 onto a surface 2012 of a workpiece 2014 on or affixed to a fixture 2016 or stage, and a controller 2018 operable to control the dual-layer micro-ribbon MEMS light modulator, laser and imaging optics to scan the linear swath of modulated light across the surface of the workpiece to record a 2D image thereon.

Preferably, the laser 2004 is capable of operating in UV wavelengths of from 355 nm through IR wavelengths up to about 2000 nm in either CW mode, or in a pulse mode with widths or durations of from about 1 fs up to about 2000 ns at a repetition rate of from about 10 kHz up to about 300 kHz, and at energy ranges of from about 10 microjoules (μJ) up to greater than 10 millijoules (mJ).

The dual-layer micro-ribbon MEMS light modulator 2002 can include any of the dual-layer micro-ribbon MEMS light modulator shown and described above.

The illumination optics 2006 can include a beam forming optical system to direct laser light onto the dual-layer micro-ribbon MEMS light modulator 2002. Referring to FIG. 20A, elements of the beam forming optical system can include a Powell lens 2020, a long axis collimating lens 2021, and a cylindrical, short axis focusing lens 2022 to shape or focus the illumination into a rectangular beam or line of illumination extending substantially uniformly across the linear array of the dual-layer micro-ribbon MEMS light modulator 2002.

The imaging optics 2008 can include galvanometric mirrors 2024 to scan the linear swath of modulated light 2010 across the surface 2012 of the workpiece 2014, a number of cylindrical lens 2026 to direct modulated light to the galvanometric mirrors, and a Fourier aperture 2028 to separate a $0^{th}$ order beam in the modulated light from $1^{st}$ order beams, and a Fourier Transform (FT) lens 2030 to focus the modulated light onto the surface of the workpiece.

Preferably, the cylindrical lens 2026 and FT lens 2030 of the imaging optics include fused silica lenses to reduce thermal focus shift of the modulated light focused onto the surface 2012 of a workpiece 2014. In some embodiments, one or more of the lenses 2020, 2021, 2022 of the illumination optics 2006 can also include fused silica lenses to reduce thermal focus shift of the laser light focused onto the dual-layer micro-ribbon MEMS light modulator 2002.

The fixture 2016 on which the workpiece 2014 to be marked is placed or affixed can include a static fixture, or a movable stage operable to move or reposition the workpiece relative to a substantially stationary linear swath of modulated light, to scan the linear swath of modulated light across the surface of the workpiece. In either embodiment, whether static or movable, the fixture 2016 preferably includes a number of sensors and signaling means to signal other components in the laser marking system when the workpiece is in proper position to be marked.

In an alternative embodiment shown in FIG. 20B, the fixture 2016 includes a movable belt 2016*a* operable to move a number of individual parts or workpieces 2014*a* past a focus of the 2000 quickly and efficiently mark or record an image or images on a number of parts or workpieces. It will be understood that because a speed at which data can be loaded to the controller 2018 for the dual-layer micro-ribbon MEMS light modulator 2002 is independent of and much greater than a speed at which the fixture 2016 or belt 2016*a* is moved and the image recorded, the laser system 2000 can customize the image recorded on each individual part or workpiece 2014/2014*a*. Such images can include, for example, a serial number, part number, and data or a data sheet for the part.

Depending on the size of the linear swath of modulated light 2010 and/or an image to be recorded it can be recorded on the surface 2012 of a workpiece 2014 in a single scan or single-stripe of the linear swath of modulated light 2010 across the surface along a single axis, or by multiple scans or stripes (multi-stripes) of the linear swath of modulated light across the surface along a first axis perpendicular to a long axis of the linear swath of modulated light, followed by repositioning the linear swath of modulated light along a second axis parallel to the long axis of the linear swath.

Thus, embodiments of A dual-layer micro-ribbon microelectromechanical systems (MEMS) device, and methods of fabricating and operating an optical system including the same have been described. Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be understood that the Detailed Description section, and not the Summary and Abstract sections, is intended to be used to interpret the claims. The Summary and Abstract sections can set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

The invention claimed is:

1. A microelectromechanical system (MEMS) device comprising:

a substrate having an upper surface;

a top modulating layer including a number of light modulating micro-ribbons, each light modulating micro-ribbon supported above and separated from the upper surface of the substrate by an actuator layer including a number of hidden-ribbons, each of the number of hidden-ribbons including at least one individually addressable actuator electrode; and an actuator for moving one or more of the number of light modulating micro-ribbons relative to the upper surface of the substrate.

2. The MEMS device of claim 1, wherein the number of hidden-ribbons are operable to enable the number of light modulating micro-ribbons to move continuously and vertically relative to the upper surface of the substrate while maintaining the number of light modulating micro-ribbons substantially parallel to one another and the upper surface of the substrate.

3. The MEMS device of claim 1, wherein the actuator for moving the number of light modulating micro-ribbons comprises electrostatic actuators operable to create an electrostatic force between a substrate electrode in the substrate and the individually addressable actuator electrodes.

4. The MEMS device of claim 3, wherein each of the number of light modulating micro-ribbons comprise a metal layer operable to form a light reflective surface to reflect light incident thereon.

5. The MEMS device of claim 4, wherein the metal layers on each of the number of light modulating micro-ribbons is further operable to form a second number of individually addressable actuator electrodes, and wherein the electrostatic actuators are further operable to create an electrostatic force between the substrate electrode and the second number of individually addressable actuator electrodes.

6. The MEMS device of claim 3, wherein the electrostatic actuators are further operable as a comb-drive to create an electrostatic force between individually addressable actuator electrodes of adjacent hidden-ribbons to lift one or more of the hidden-ribbons.

7. The MEMS device of claim 1, wherein the actuator for moving the number of light modulating micro-ribbons comprises electrostatic actuators operable as a comb-drive to create an electrostatic force between individually addressable actuator electrodes of adjacent hidden-ribbons to lift one or more of the hidden-ribbons.

8. The MEMS device of claim 1, wherein each of the hidden-ribbons underlies one of the number of light modulating micro-ribbon and has a long axis parallel with a long axis of the light modulating micro-ribbon, and extending under substantially an entire length of the light modulating micro-ribbon.

9. The MEMS device of claim 1, wherein each of the hidden-ribbons underlies a plurality of the number of light modulating micro-ribbon and has a long axis that is not parallel with long axes of the light modulating micro-ribbons.

10. The MEMS device of claim, 1 wherein the number of hidden-ribbons comprises one or more of hidden-ribbons at each end of each of the number of light modulating micro-ribbons separated along a long axis of the light modulating micro-ribbon.

11. The MEMS device of claim 10, wherein the number of hidden-ribbons comprise a width perpendicular to the long axes of the number of light modulating micro-ribbons larger than a width of each of the light modulating micro-ribbons, and wherein a position of each of the number of light modulating micro-ribbons is offset along the long axes thereof so that the one or more of hidden-ribbons at each end of each of the number of light modulating micro-ribbons partially underlies an adjacent light modulating micro-ribbon, and a separation between each adjacent light modulating micro-ribbons is independent of the width of the number of hidden-ribbons.

12. The MEMS device of claim 1, wherein each of the number of hidden-ribbons comprise a tensile silicon-germanium (SiGe) layer.

13. The MEMS device of claim 12, wherein the SiGe layer of each of the number of hidden-ribbons functions as the individually addressable actuator electrode.

14. The MEMS device of claim 1, wherein each of the light modulating micro-ribbon comprise a tensile silicon-germanium (SiGe) layer.

15. An optical system comprising:

a light source; and a microelectromechanical system (MEMS) device operable to receive and modulate light from the light source, the MEMS device comprising:

a substrate having an upper surface;

a top modulating layer including a number of light modulating micro-ribbons, each light modulating micro-ribbon supported above and separated from the upper surface of the substrate by an actuator layer including a number of hidden-ribbons, each of the number of hidden-ribbons including at least one individually addressable actuator electrode; and an actuator for moving one or more of the number of light modulating micro-ribbons relative to the upper surface of the substrate.

16. The system of claim 15, wherein the actuator for moving the number of light modulating micro-ribbons comprises electrostatic actuators operable to create an electrostatic force between a substrate electrode in the substrate and the individually addressable actuator electrodes.

17. The system of claim 16, wherein the electrostatic actuators are further operable as a comb-drive to create an electrostatic force between individually addressable actuator electrodes of adjacent hidden-ribbons to lift one or more of the hidden-ribbons.

18. The system of claim 15, wherein the actuator for moving the number of light modulating micro-ribbons comprises electrostatic actuators operable as a comb-drive to create an electrostatic force between individually addressable actuator electrodes of adjacent hidden-ribbons to lift one or more of the hidden-ribbons.

19. The system of claim 15, wherein the system is a light detection and ranging (LiDAR) system, and wherein the MEMS device is operable to modulate phases of at least some of the received light to project light onto a far field scene in two-dimensions, the two-dimensions including a first direction over which the light is dispersed to form a swath of illumination and a second dimension over which the swath is steered by modulating phases of the light received from the light source.

20. The system of claim 15, wherein the system is an additive manufacturing system.

21. The system of claim 15, wherein the system is a laser marking or surface modification system.

* * * * *